(12) United States Patent
Ikeda et al.

(10) Patent No.: US 7,420,839 B2
(45) Date of Patent: Sep. 2, 2008

(54) MAGNETIZATION REVERSAL METHOD FOR APPLYING A MULTI-DIRECTIONAL EXTERNAL MAGNETIC FIELD TO A PERPENDICULAR MAGNETORESISTIVE FILM

(75) Inventors: Takashi Ikeda, Kanagawa (JP); Yoshinobu Sekiguchi, Tokyo (JP); Naoki Nishimura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/410,705

(22) Filed: Apr. 24, 2006

(65) Prior Publication Data

US 2006/0203539 A1    Sep. 14, 2006

Related U.S. Application Data

(62) Division of application No. 09/960,743, filed on Sep. 24, 2001, now Pat. No. 7,035,138.

(30) Foreign Application Priority Data

Sep. 27, 2000   (JP)   ............... 2000-294255
Sep. 27, 2000   (JP)   ............... 2000-294256
Mar. 28, 2001   (JP)   ............... 2001-092388
Aug. 21, 2001   (JP)   ............... 2001-250124

(51) Int. Cl.
*G11C 11/15* (2006.01)
(52) U.S. Cl. .................. 365/173; 365/171; 365/158
(58) Field of Classification Search ................ 365/173, 365/171, 158
See application file for complete search history.

(56) References Cited

U.S. PATENT DOCUMENTS

| | | | |
|---|---|---|---|
| 5,045,412 A | 9/1991 | Nasu et al. | ............... 428/836.2 |
| 5,587,974 A | 12/1996 | Nishimura | ............... 369/13.38 |
| 5,589,040 A | 12/1996 | Nishimura | ............. 204/192.26 |
| 5,616,428 A | 4/1997 | Nishimura et al. | .... 428/694 ML |
| 5,656,384 A | 8/1997 | Nishimura et al. | .... 428/694 ML |
| 5,663,935 A | 9/1997 | Nishimura | ............... 369/13.51 |
| 5,666,346 A | 9/1997 | Nishimura | ............... 369/275.2 |
| 5,717,662 A | 2/1998 | Nishimura | ............... 369/13.44 |
| 5,719,829 A | 2/1998 | Nishimura | ............... 369/13.38 |

(Continued)

FOREIGN PATENT DOCUMENTS

EP    0 933 782 A2    8/1999

(Continued)

OTHER PUBLICATIONS

"Thin Ferromagnetic Films" by M. Prutton (pp. 96 to 115), Butterworths, London (1964).

*Primary Examiner*—Andrew Q Tran
(74) *Attorney, Agent, or Firm*—Fitzpatrick, Cella, Harper & Scinto

(57) ABSTRACT

A magnetization reversal method is disclosed in which an external magnetic field is applied to a magnetoresistive film requiring a strong magnetic film for reversal. A weak magnetic field is applied when magnetically coupled perpendicular magnetic films are used in which the magnetoresistive film has a structure wherein a nonmagnetic film is placed between magnetic films with an easy axis of magnetization along a perpendicular direction to a film plane, and in which said external magnetic field is comprised of magnetic fields from a plurality of directions including a direction of easy magnetization of the magnetic films.

2 Claims, 20 Drawing Sheets

U.S. PATENT DOCUMENTS

| | | | | |
|---|---|---|---|---|
| 5,732,049 A | 3/1998 | Nishimura | | 369/13.48 |
| 5,774,429 A | 6/1998 | Nishimura | | 369/13.51 |
| 5,774,430 A | 6/1998 | Ikeda | | 369/13.4 |
| 5,790,513 A | 8/1998 | Hiroki et al. | | 369/275.2 |
| 5,810,979 A | 9/1998 | Nishimura et al. | | 204/192.2 |
| 5,830,589 A | 11/1998 | Nishimura | | 428/694 MM |
| 5,862,105 A | 1/1999 | Nishimura | | 369/13.42 |
| 5,889,739 A | 3/1999 | Nishimura et al. | | 369/13.07 |
| 5,917,749 A * | 6/1999 | Chen et al. | | 365/173 |
| 5,935,701 A | 8/1999 | Nishimura | | 428/332 |
| 6,097,626 A | 8/2000 | Brug et al. | | 365/171 |
| 6,111,784 A | 8/2000 | Nishimura | | 365/173 |
| 6,125,083 A | 9/2000 | Nishimura et al. | | 369/13.46 |
| 6,134,139 A | 10/2000 | Bhattacharyya et al. | | 365/171 |
| 6,187,460 B1 | 2/2001 | Nishimura | | 428/694 MM |
| 6,219,275 B1 * | 4/2001 | Nishimura | | 365/173 |
| 6,226,197 B1 | 5/2001 | Nishimura | | 365/171 |
| 6,307,816 B1 | 10/2001 | Nishimura | | 369/13.07 |
| 6,654,279 B2 * | 11/2003 | Nishimura | | 365/173 |
| 6,724,651 B2 * | 4/2004 | Hirai | | 365/158 |
| 6,816,431 B1 * | 11/2004 | Lu et al. | | 365/230.07 |
| 6,829,121 B2 * | 12/2004 | Ikeda et al. | | 428/811.5 |
| 6,844,605 B2 * | 1/2005 | Nishimura | | 257/421 |
| 6,847,545 B2 | 1/2005 | Nishimura | | 365/158 |
| 6,853,580 B2 * | 2/2005 | Nishimura | | 365/158 |
| 6,934,184 B2 * | 8/2005 | Amano et al. | | 365/173 |
| 7,046,546 B1 * | 5/2006 | Inaba | | 365/158 |
| 7,046,547 B2 * | 5/2006 | Witcraft et al. | | 365/158 |

FOREIGN PATENT DOCUMENTS

| | | |
|---|---|---|
| EP | 0 959 476 A2 | 11/1999 |
| EP | 1 115 164 A2 | 7/2001 |

* cited by examiner

FILM STRUCTURE:
Si/Gd17Fe83(30nm)/Pt(2nm)

"0"

"1"

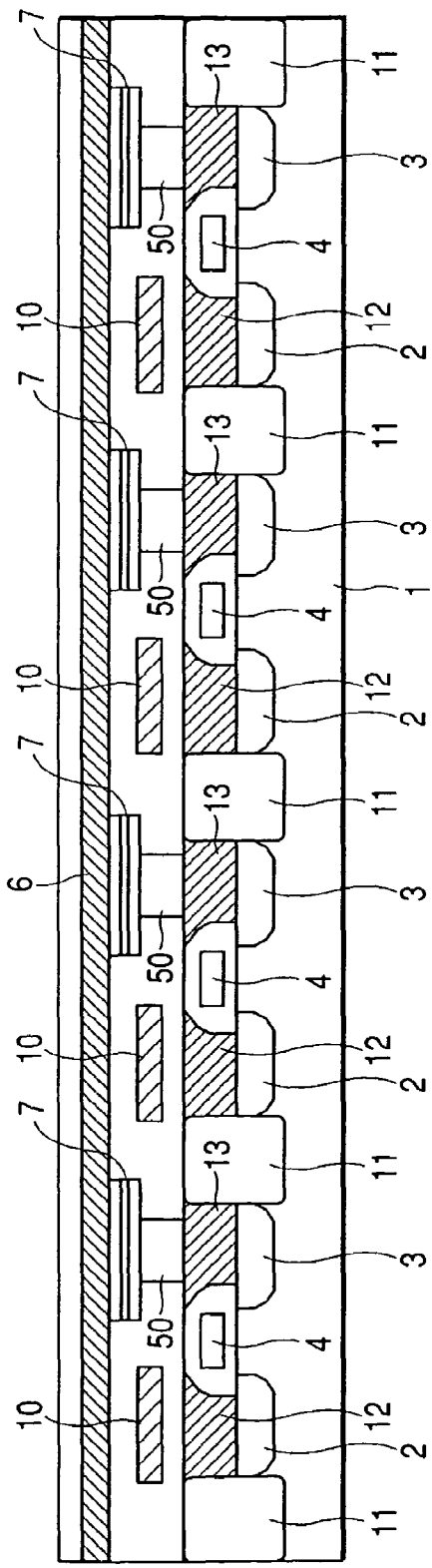
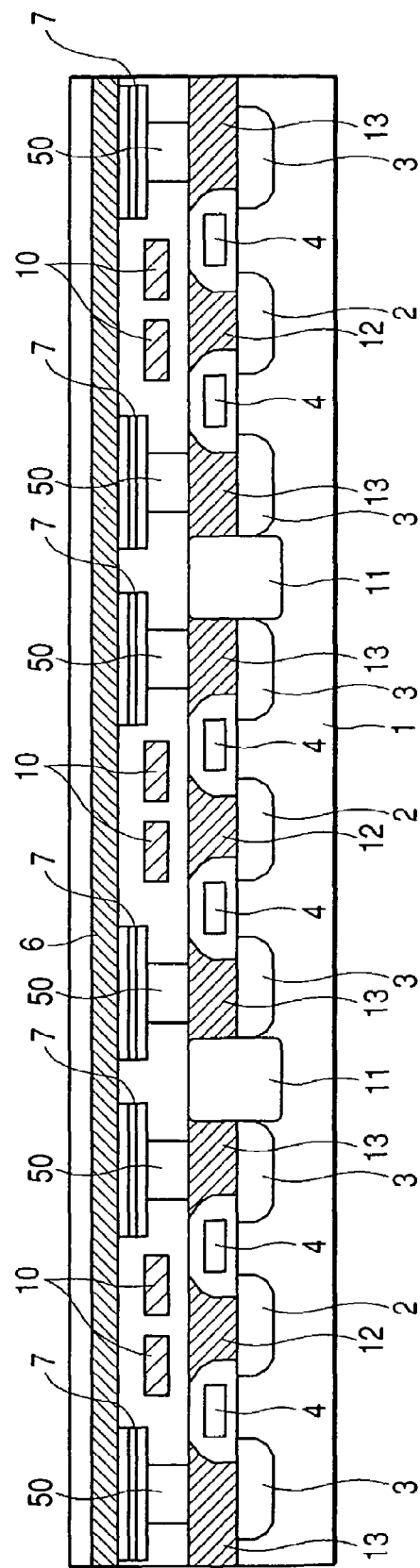

MAGNETIZATION REVERSAL METHOD FOR APPLYING A MULTI-DIRECTIONAL EXTERNAL MAGNETIC FIELD TO A PERPENDICULAR MAGNETORESISTIVE FILM

RELATED APPLICATION

This application is a divisional of U.S. application Ser. No. 09/960,743, filed Sep. 24, 2001, the entire content of which is hereby incorporated herein by reference.

BACKGROUND OF THE INVENTION

1. Field of the Invention

The present invention relates to methods of reversing a direction of magnetization in a magnetic film, magnetoresistive films, and magnetic memories using them.

2. Related Background Art

In recent years, semiconductor memories being solid state memories are frequently used in information equipment and there are a variety of types of semiconductor memories including DRAM, FeRAM, flash EEPROM, and so on. These semiconductor memories have both merits and demerits of characteristics and there exists no memory satisfying all the specifications required in the current information equipment. For example, DRAM permits high recording density and many rewriting operations, but is volatile and thus loses information without supply of power. Flash EEPROM is nonvolatile, but takes a long time for erasing and is thus not suitable for fast processing of information.

Under the present circumstances of semiconductor memories as described above, memories making use of the magnetoresistance effect (magnetic random access memories: MRAMs) are promising as memories satisfying the specifications required in many information devices, including the recording time, reading time, recording density, the number of rewriting operations permitted, power consumption, and so on. Particularly, MRAMs making use of the spin-dependent tunneling magnetoresistance effect provide great read signals and are thus advantageous in terms of increase in recording density or in terms of fast reading, and the feasibility of MRAMs is justified in recent research reports.

The fundamental structure of magnetoresistive films used as devices of MRAMs is the sandwich structure in which magnetic layers are adjacent to each other with a nonmagnetic layer in between. Materials often used for the nonmagnetic film are electroconductive materials such as Cu and the like, and insulators such as $Al_2O_3$ and the like. Magnetoresistive films using a conductor of Cu or the like as the nonmagnetic layer are called giant magnetoresistive (GMR) films, and magnetoresistive films using an insulator of $Al_2O_3$ or the like as the nonmagnetic layer are called spin-dependent tunneling magnetoresistive (TMR) films. Since the TMR films exhibit the magnetoresistance effect greater than the GMR films, the TMR films are preferable as memory devices of MRAMs.

The magnetoresistive films demonstrate a relatively low electric resistance with magnetization directions of the two magnetic layers being parallel, but a relatively large electric resistance with the magnetization directions of the two magnetic layers being antiparallel. Accordingly, it is feasible to read information out by making use of the above nature, using one magnetic layer as a recording layer and the other as a readout layer.

For recording and reproduction of information in MRAMs, it is thus necessary to change the magnetization directions of the magnetic films forming the magnetoresistive film. For changing the magnetization directions, it is necessary, to apply a magnetic field not less than a magnetic field for reversal of magnetization (magnetization reversal field) of the magnetic films.

The magnetization reversal field of the magnetic films will be described below. Main examples of magnetic films with an easy axis of magnetization along the perpendicular direction to the film surface are alloy films and artificial lattice films of rare earth metal and transition metal, artificial lattice films of transition metal and noble metal such as Co/Pt or the like, alloy films with magnetocrystalline anisotropy in the perpendicular direction such as CoCr or the like, and so on. The magnetization reversal field of these magnetic films largely varies depending upon the composition, film-forming methods, and so on. Particularly, the alloy films of rare earth metal and transition metal are greatly affected by the composition. The reason is that the sublattice magnetization of rare earth atoms is antiparallel to that of the transition metal. Namely, when the sublattice magnetizations of the respective metals are substantially equal in magnitude (near the compensation composition), the alloy films have small apparent magnetization and are thus rarely affected by an external magnetic field. When there is a big difference between the sublattice magnetizations of the respective metals on the other hand, the alloy films have large apparent magnetization and are thus largely affected by the external magnetic field. This means that the magnetization reversal field is high near the compensation composition, but the magnetization reversal field becomes lower as deviation becomes larger from the compensation composition. However, if the intensity of apparent magnetization becomes too high, the easy axis of magnetization will deviate from the perpendicular direction because of influence of a demagnetizing field. Among the alloys of rare earth metal and transition metal, GdFe demonstrates small values of the magnetization reversal field, which are approximately several thousand A/m even near the critical composition where the easy axis of magnetization starts inclining from the perpendicular direction. Such values are too large to apply the alloy films, for example, to the memory devices.

In general, when compared with perpendicular magnetic films, longitudinal (in-plane) magnetic films exhibit smaller magnetization reversal fields, but the longitudinal magnetic films tend to increase the magnetization reversal field with decrease in device size. The magnetization reversal field can be higher in the longitudinal magnetic films in certain device size than in the perpendicular magnetic films.

For future increase in density of integration of MRAMs, use of the perpendicular magnetic films as memory devices permits production of magnetoresistive films in small size and is expected to decrease the size of MRAM itself and increase the density thereof, because they are free of problems of curling of magnetization and the aforementioned rise of the magnetization reversal field, which arise in the longitudinal magnetic films.

In the case of the perpendicular magnetic films, however, it is necessary to apply a perpendicular magnetic field strong enough to reverse the magnetization direction in at least one magnetic layer, and thus magnetization reversal methods are still susceptible to study, because the magnetization reversal field of the perpendicular magnetic films is generally high as described above. In the MRAM, it is necessary to record or reproduce information by selecting a specific memory device out of a number of memory cells arrayed in a matrix pattern. There is thus a need for a method of effectively applying the magnetic field to the specific memory device. If the specific device were selected by simply applying a strong magnetic field to the magnetic films, it would be possible to apply the strong magnetic field by supplying a large electric current to a write line or by providing a plurality of write lines per device. However, the flow of the large current in conductor lines is not preferable in terms of heat design or power supply capacity and it is necessary to set the current at least to below a value where the write lines suffer discontinuity due to electromigration. Even within the range below the value, it is desirable to set the current as small as possible, in view of power consumption. The provision of plural write lines per device of magnetoresistive film inevitably increases the device area by that degree, and imposes severe constraints on the layout in the memory cells, thus making high integration difficult.

As described above, in the case wherein the memory devices or the like are constructed of the magnetoresistive film using the perpendicular magnetic films, or even in the case using the longitudinal magnetic films, there will arise issues including the increase in the device area, the increase in power consumption, etc. due to the rise of the magnetization reversal field, in conjunction with future decrease of device size.

SUMMARY OF THE INVENTION

In view of the above issues, an object of the present invention is to provide methods of reversing magnetization in a magnetic film requiring a strong magnetic field for reversal of magnetization, by applying a weak magnetic field, in the case of the perpendicular magnetic films being used, in the case of multilayer films being magnetically coupled, and in the case of magnetic films being reduced in size, and to provide MRAMs permitting easy selection of a specific memory device and permitting size reduction without increase in power consumption.

The above object is accomplished by a magnetization reversal method of applying an external magnetic field to a magnetoresistive film; wherein said magnetoresistive film has a structure in which a nonmagnetic film is placed between magnetic films with an easy axis of magnetization along a perpendicular direction to a film plane and wherein said external magnetic field comprises magnetic fields from a plurality of directions including a direction of the easy axis of magnetization of said magnetic films.

The above object is also accomplished by a magnetization reversal method of applying a magnetic field from outside to a magnetic film with an easy axis of magnetization along a perpendicular direction to a film plane to change a direction of magnetization, wherein said magnetic field applied is a magnetic field from a direction inclined from the easy axis of magnetization of said magnetic film.

The above object is also accomplished by a magnetoresistive film comprising a first magnetic film and a second magnetic film with an easy axis of magnetization along a perpendicular direction to a film plane, and having a structure in which a nonmagnetic layer is placed between said first magnetic film and second magnetic film, wherein a magnetization reversal magnetic field of said first magnetic film<a magnetization reversal magnetic field of said second magnetic film, and wherein said second magnetic film undergoes reversal of magnetization by simultaneously applying the magnetization reversal magnetic field of said first magnetic film and a magnetic field inclined from the easy axis of magnetization.

The above object is also accomplished by a magnetoresistive film comprising a first magnetic film and a second magnetic film with an easy axis of magnetization along a perpendicular direction to a film plane, and having a structure in which a nonmagnetic film is placed between said first magnetic film and said second magnetic film, wherein said first magnetic film undergoes reversal of magnetization by applying a magnetic field in a direction of the easy axis of magnetization and a magnetic field in a direction inclined from the easy axis of magnetization, and wherein said second magnetic film does not undergo reversal of magnetization by the magnetic fields applied to said first magnetic film.

The above object is also accomplished by a magnetic memory comprising:

a substrate;

a magnetoresistive film provided on the substrate, which has a structure in which a nonmagnetic layer is placed between a plurality of magnetic films with an easy axis of magnetization along a perpendicular direction to a film plane;

a write line for applying a magnetic field to said magnetoresistive film; and a bit line provided on the opposite side to said substrate with respect to the magnetoresistive film, wherein magnetization in at least one magnetic film of said magnetoresistive film is reversed by magnetic fields generated by electric currents flowing in said write line and in said bit line.

The above object is also accomplished by a magnetic memory comprising:

a substrate;

a magnetoresistive film provided on the substrate, which has a structure in which a nonmagnetic layer is placed between a plurality of magnetic films with an easy axis of magnetization along a perpendicular direction to a film plane;

a write line for applying a magnetic field to said magnetoresistive film; and a bit line provided on the opposite side to said substrate with respect to the magnetoresistive film, wherein the magnetic field from said write line is applied in a direction of the easy axis of magnetization of said magnetic films of said magnetoresistive film and a magnetic field from said bit line is applied in a direction inclined from the easy axis of magnetization.

The above object is also accomplished by a magnetic memory comprising:

a substrate;

a magnetoresistive film formed on the substrate, which has a structure in which a nonmagnetic layer is placed between magnetic films with an easy axis of magnetization along a perpendicular direction to a film plane;

a write line for applying a magnetic field to said magnetoresistive film; and a bit line provided on the opposite side to said substrate with respect to said magnetoresistive film, said magnetic memory comprising means for applying an external magnetic field to the magnetic films of said magnetoresistive film while varying an intensity or a direction of the external magnetic field.

The above object is also accomplished by a magnetic memory comprising:

a substrate;

magnetoresistive films formed in a matrix pattern on the substrate;

a write line for applying a magnetic field to said magnetoresistive films; and a bit line provided on the opposite side to said substrate with respect to said magnetoresistive films, wherein in said magnetoresistive films, a first magnetic film, a second magnetic film, a nonmagnetic film, a third magnetic film, and a fourth magnetic film are stacked in the order named, at least the first and fourth magnetic films have their easy axis of magnetization along a perpendicular direction to a film plane, and said second and third magnetic films have greater longitudinal magnetic anisotropy than that of said first and second magnetic films, wherein at the same time as the magnetic field is applied in a direction of easy magnetization of said first and second magnetic films from said write line, a magnetic field is applied in a direction inclined from the easy axis of magnetization from said bit line, thereby selecting a specific magnetoresistive film.

The above object is also accomplished by a magnetic memory comprising:

a substrate, and a plurality of magnetoresistive films formed in a matrix pattern on the substrate, said magnetoresistive films each having a structure in which a nonmagnetic layer is placed between magnetic films with an easy axis of magnetization along a perpendicular direction to a film plane;

a write line for applying a magnetic field to said magnetoresistive films; and a bit line on the opposite side to said substrate with respect to said magnetoresistive films, wherein the magnetic field from said write line and a magnetic field from said bit line are simultaneously applied, application of the magnetic field from the bit line is first stopped, and thereafter application of the magnetic field from the write line is stopped after magnetization of said magnetoresistive films has been aligned in the direction of the magnetic field from said write line, thereby implementing recording or reproduction of information.

The details will be described hereinafter in embodiments.

BRIEF DESCRIPTION OF THE DRAWINGS

FIGS. 7A, 7B, 7C and 7D are diagrams for explaining the principles of recording and reproduction in the magnetoresistive film using the perpendicular magnetic films, wherein FIG. 7A and FIG. 7B are cross-sectional views schematically showing states of magnetization in reading of recorded information "1" and wherein FIG. 7C and FIG. 7D are views schematically showing states of magnetization in reading of recorded information "0";

FIG. 25 is a schematic view showing an MRAM structure in Embodiment 8;

FIG. 26 is a schematic view showing an MRAM structure in Embodiment 9;

DETAILED DESCRIPTION OF THE PREFERRED EMBODIMENTS

The present invention will be described below in detail with reference to the drawings.

Figure 1:
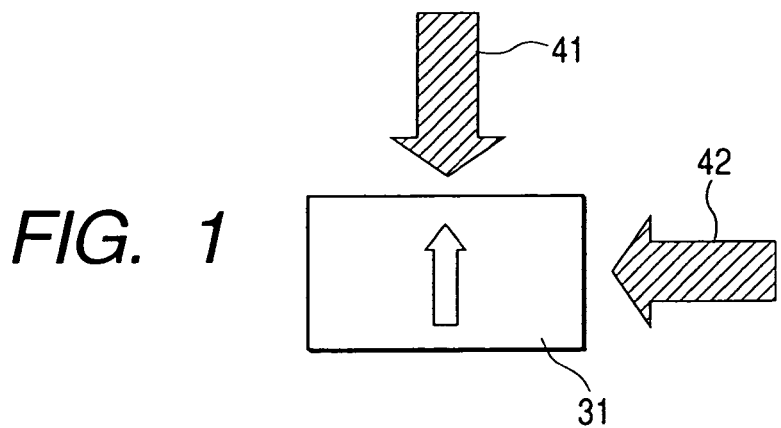
FIG. 1 is a schematic diagram for explaining an example of the magnetization reversal method according to the present invention.
Figure 2:
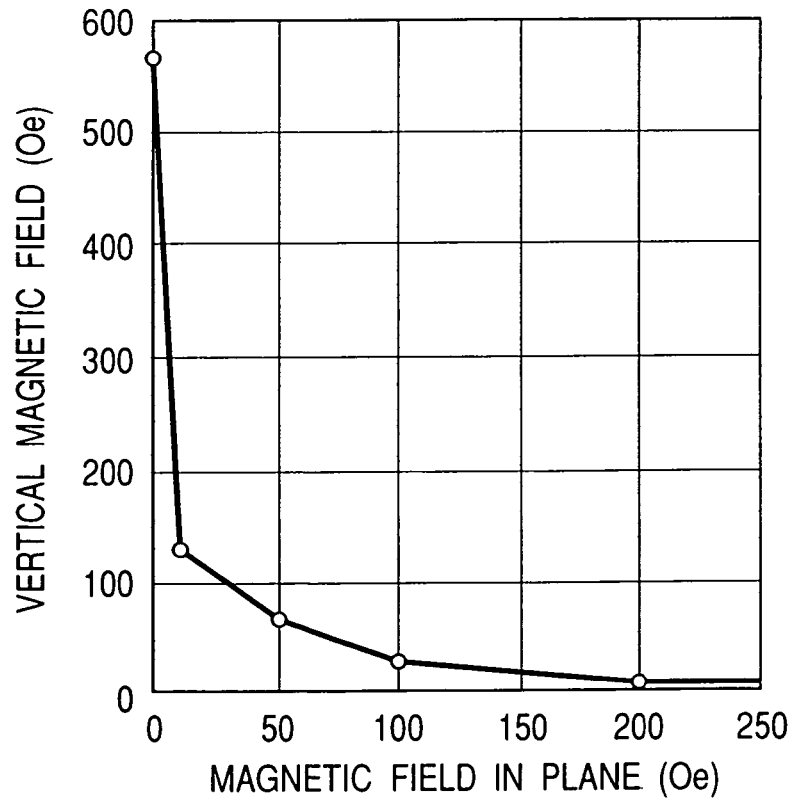
FIG. 2 is a graph showing the intensity of magnetic fields necessary for reversal of the direction of magnetization directed in the perpendicular direction in the magnetic layer, where the external magnetic field is applied from the perpendicular direction and from the both longitudinal and perpendicular directions to the magnetic film with perpendicular magnetic anisotropy.

FIG. 1 is a conceptual drawing for explaining directions of external magnetic fields upon reversal of magnetization. A magnetic film 31 is a perpendicular magnetic film. The magnetic fields are applied from two directions, perpendicular direction 41 and longitudinal direction 42. FIG. 2 is a graph showing the intensity of the magnetic fields necessary for reversal of the direction of magnetization directed in the perpendicular direction in the magnetic layer when the external fields are applied from the both perpendicular and longitudinal directions. The ordinate of FIG. 2 indicates the intensity of the perpendicular magnetic field necessary for reversal of the magnetization direction of the magnetic layer whose easy axis of magnetization lies along the perpendicular direction, and the abscissa the magnetic field simultaneously applied in the longitudinal direction to the film. FIG. 2 shows the result of simulation using the data of Ms (magnetization): 100 emu/cm$^3$ and Ku (perpendicular magnetic anisotropy constant): $2\times10^4$ erg/cm$^3$, in which the size of the magnetic film used for calculation was $0.1\times0.1$ μm and the thickness 40 nm.

It is seen from FIG. 2 that, when the longitudinal magnetic field is also applied to the magnetic layer at the same time as application of the perpendicular magnetic field, the intensity of the perpendicular magnetic field necessary for the reversal of magnetization in the magnetic layer can be largely reduced, as compared with the case without application of the longitudinal magnetic field.

When the longitudinal magnetic field is also applied to the magnetic layer at the same time as the application of the perpendicular magnetic field, the total of the perpendicular magnetic field and the longitudinal magnetic field necessary for the reversal of magnetization can be largely decreased, as compared with application of the perpendicular magnetic field alone. This makes it feasible to reverse the magnetization by the magnetic field weaker than in the case of the magnetic field being applied only from the perpendicular direction.

Figure 3:
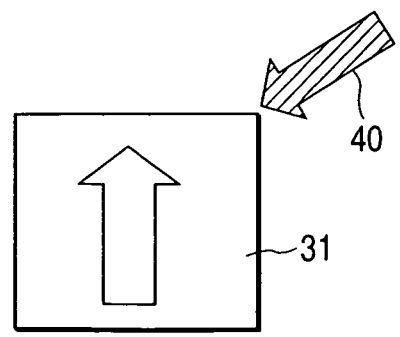
FIG. 3 is a schematic diagram for explaining an example of the magnetization reversal method according to the present invention.

By applying magnetic fields from a plurality of directions and altering intensities or a ratio of intensities, and directions of application thereof, a resultant magnetic field can be applied in any desired direction within a plane including the normal direction to the film surface, to the magnetic film. Namely, it becomes feasible to apply the magnetic field from either of directions inclined at angles of 0 to $\pi/2$ relative to the perpendicular direction being the easy axis of magnetization. When the magnetic fields in the perpendicular direction and in the longitudinal direction are applied simultaneously and in the same intensity, the resultant magnetic field can be applied from the direction inclined at the angle of $(\pi/4)$ rad relative to the easy axis of magnetization, as shown in FIG. 3.

The magnetization reversal mechanisms of the magnetic film will be described hereinafter in detail. The description will be provided separately for the longitudinal magnetic film and for the perpendicular magnetic film.

First described is the reversal of magnetization in the longitudinal magnetic film. When the external magnetic fields are applied in the direction of easy magnetization and in a direction inclined from the easy axis of magnetization within the same plane as the easy axis of magnetization, the coercive force is dependent upon an angle between the easy axis of magnetization of the magnetic film and the externally applied field, and the coercive force becomes smaller with the magnetic field being inclined from the easy axis of magnetization than with the magnetic field being directed along the easy axis of magnetization. However, the magnetic field for saturation of magnetization, i.e., the magnetic field for perfectly aligning magnetization with the direction of easy magnetization, becomes stronger on the other hand. This phenomenon is reported as to permalloy thin films by M. Prutton in Thin Ferromagnetic Films, p103, Butterworths, London (1964). Accordingly, the coercive force can be made small but the lowering of the magnetization reversal magnetic field is not made so high as expected, by simply applying the magnetic fields from the direction of easy magnetization and a direction different therefrom in the longitudinal magnetic film.

Described next is the reversal of magnetization in the case wherein the magnetic fields are applied in the direction of easy magnetization and in a direction inclined from the easy axis of magnetization in the magnetic film with perpendicular magnetic anisotropy, particularly, in the film having the easy axis of magnetization along the perpendicular direction. It is, however, noted that the magnetic fields applied in the magnetic film with longitudinal magnetic anisotropy are always applied in longitudinal directions in the same plane even if they are applied from a plurality of directions, but in the case of the perpendicular magnetic film the magnetic fields are not always applied in the same plane.

It was also found that when the magnetic field was applied from the direction inclined from the easy axis of magnetization, as shown in FIG. 2, the coercive force became small in the perpendicular magnetic film, as in the longitudinal magnetic film. In addition, different from the case of the magnetic film with longitudinal magnetic anisotropy, the magnetic field for saturation of magnetization was not so strong even with the inclination of the applied magnetic field from the easy axis of magnetization as in the case of the longitudinal magnetic film.

This is conceivably because the magnetization reversal mechanism of the perpendicular magnetic film is different from that of the magnetic film with longitudinal magnetic anisotropy. Namely, rotation of spins is dominant during the reversal of magnetization in the longitudinal magnetic film, whereas simultaneous reversal of magnetization is dominant in the perpendicular magnetic film. For this reason, the phenomenon of increase in the magnetization saturation field does not appear so prominent in the perpendicular magnetic film as in the longitudinal magnetic film even if the magnetic field is applied from the direction inclined from the easy axis of magnetization.

This will be specifically described with reference to the results of measurement of magnetization curve.

Figure 4:
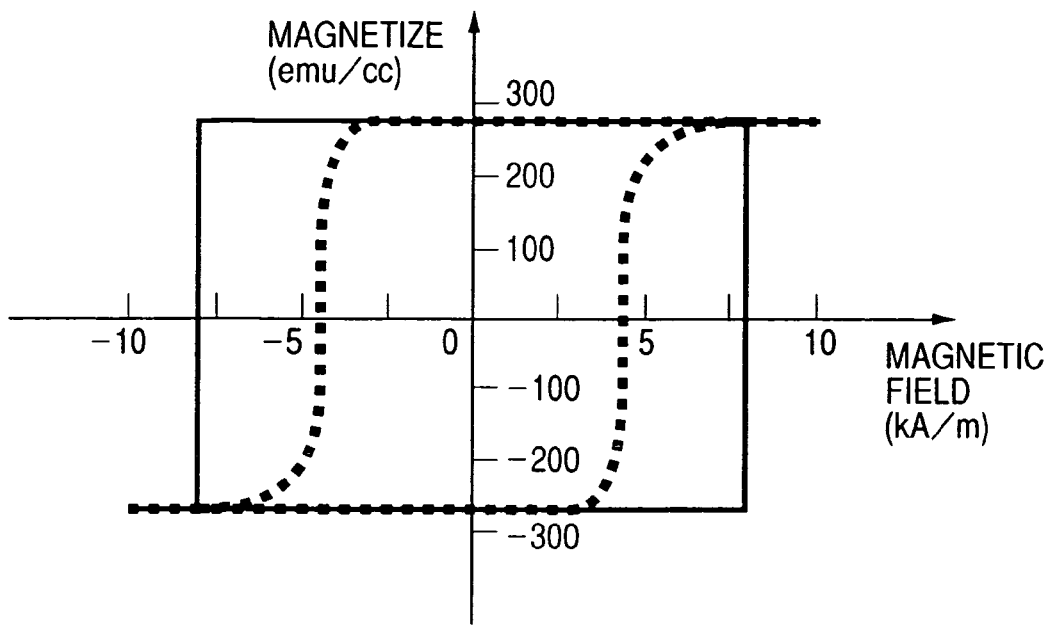
FIG. 4 is a magnetization curve for explaining an example of the magnetization reversal method according to the present invention.

FIG. 4 shows a magnetization curve obtained when the magnetic fields are applied to a magnetic film with the easy axis of magnetization along the perpendicular direction from the direction of easy magnetization and from a direction inclined from the direction of easy magnetization, e.g., from the longitudinal direction. The film structure of the magnetic film is one wherein a film of $Gd_{17}Fe_{83}$ is formed in the thickness of 30 nm on an Si substrate and a film of Pt is formed as a protective layer in the thickness of 2 nm thereon. Let us suppose the direction of magnetization in the magnetic film is upward, the magnetic field is applied in a fixed intensity in the longitudinal direction, and the magnetic field in the perpendicular direction is applied in the antiparallel direction to the direction of magnetization, i.e., downward. As the intensity of the magnetic field in the perpendicular direction is gradually increased from zero, the resultant magnetic field gradually changes its direction from $\pi/2$ relative to the perpendicular direction, and the magnetization starts being reversed at a certain point. The magnetic field in the perpendicular direction is further intensified up to saturation of magnetization, and thereafter the intensity of the magnetic field is gradually decreased. Then the magnetic-field applied in the perpendicular direction is reversed and the intensity of the magnetic field is again increased.

A curve indicated by a dashed line is a magnetization curve measured with application of the magnetic fields in the direction of easy magnetization and in the direction inclined from the direction of easy magnetization, i.e., in the longitudinal direction herein as described above, and a curve indicated by a solid line a magnetization curve measured with application of the magnetic field only in the direction of easy magnetization. It is seen from the figure that the coercive force and the magnetization reversal field are lower than in the case of application of the magnetic field only in the direction of easy magnetization.

Figure 5:
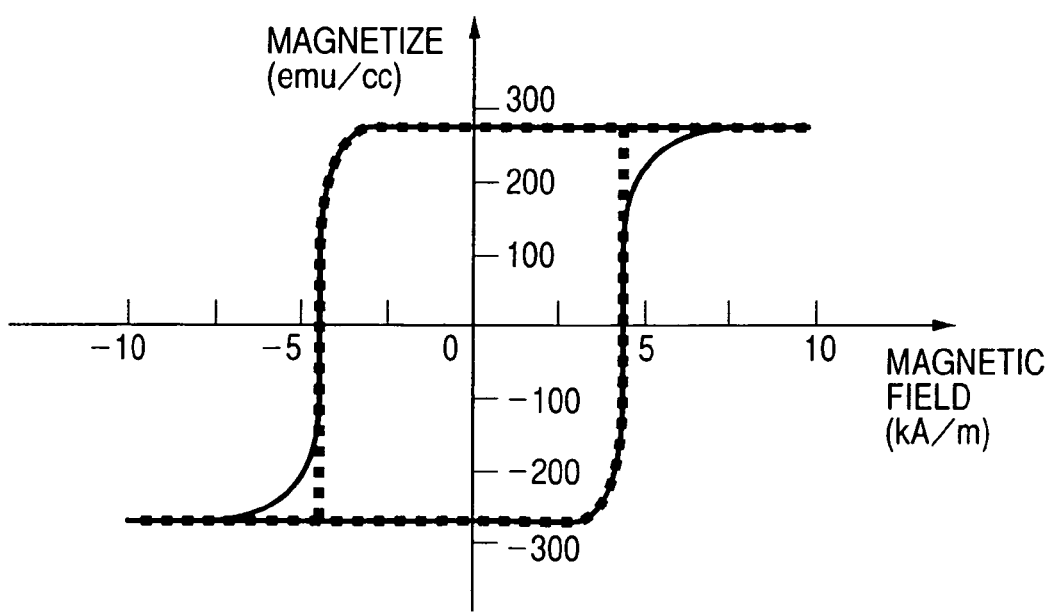
FIG. 5 is a magnetization curve for explaining another example of the magnetization reversal method according to the present invention.

In the next place, the magnetic fields are applied by a method of first simultaneously applying the magnetic fields in the longitudinal direction and in the perpendicular direction to the magnetic film with the easy axis of magnetization along the perpendicular direction, to reverse the magnetization substantially, and thereafter stopping the application of the magnetic field in the longitudinal direction. The film structure of the magnetic film was the same as that in the measurement shown in FIG. 4. The result is presented by a dashed line in FIG. 5. A solid line in FIG. 5 indicates a magnetization curve obtained when the magnetic fields are continuously applied simultaneously in the longitudinal direction and in the perpendicular direction. When the application of the magnetic field in the longitudinal direction is stopped after the substantial reversal of magnetization, the magnetization immediately reaches saturation in the perpendicular direction. Therefore, this method permits complete reversal of magnetization to be achieved by the weaker applied field.

A conceivable reason for this is that the perpendicular magnetic anisotropy exerts a force to direct the magnetization in the perpendicular direction, while the magnetization is apt to turn into the direction of the magnetic field applied, i.e., the direction of the resultant magnetic field of the magnetic field applied in the perpendicular direction and the magnetic field applied in the longitudinal direction.

Further, this phenomenon will be considered for separate domain structures, multiple domain structure and single domain structure. In the case of the multiple domain structure, there is a possibility of forming magnetic domains and it is speculated that the magnetization can be sometimes resistant to being aligned in one direction because of the application of the magnetic field in the direction inclined from the easy axis of magnetization. In the case of the magnetic film having the single domain structure, the magnetization is aligned in the perpendicular direction because of the perpendicular magnetic anisotropy, but the magnetization can be sometimes resistant to being directed in the perpendicular direction, for the reasons that the magnetic film has small perpendicular magnetic anisotropy, the magnetic film has the film structure or film shape resistant to rotation of magnetization, and so on. Namely, it is speculated that, depending upon the characteristics, structure, or shape of the magnetic material, the magnetic field applied in the longitudinal direction can act to impede saturation of the reversed magnetization.

Figure 6:
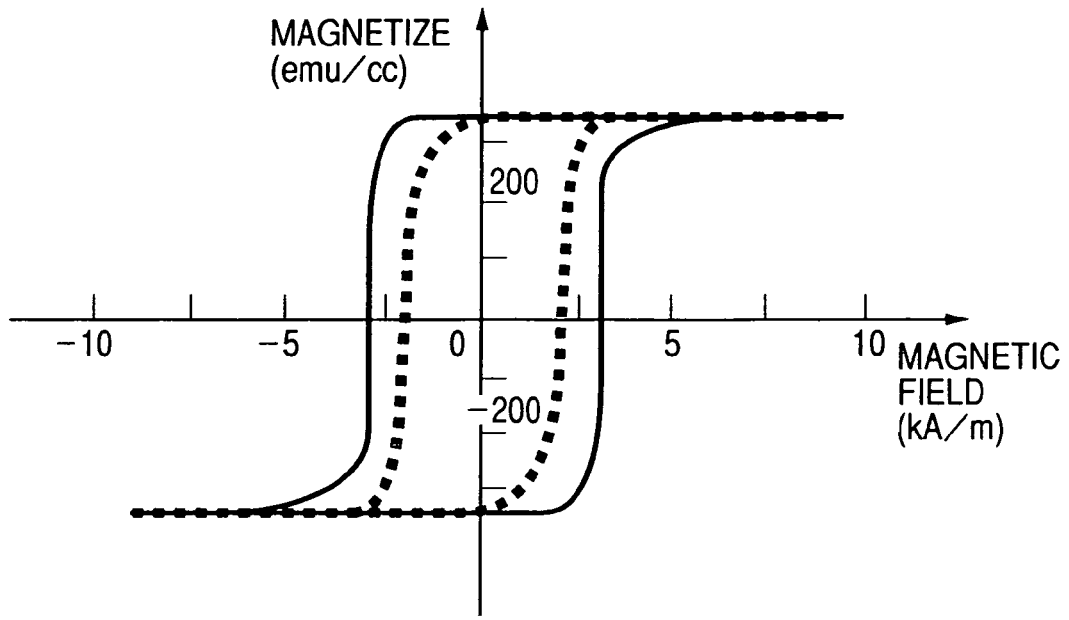
FIG. 6 is a magnetization curve for explaining another example of the magnetization reversal method according to the present invention.

Next, FIG. 6 shows magnetization curves obtained when the magnetic film exchange-coupled films consisting of a magnetic film with the easy axis of magnetization along the perpendicular direction and a magnetic film with greater longitudinal magnetic anisotropy than the foregoing magnetic film. The film structure of the magnetic film is such that a film of $Gd_{18}Fe_{82}$ is formed in the thickness of 30 nm on an Si substrate, a film of Fe is formed in the thickness of 1 nm thereon, and a film of Pt is formed as a protective layer in the thickness of 2 nm thereon. A solid line indicates a magnetization curve where the magnetic field is applied only in the perpendicular direction, and a dashed line a magnetization curve where the magnetic fields are applied simultaneously in the perpendicular direction and in the longitudinal direction. The perpendicular magnetic film exchange-coupled with the magnetic film having the longitudinal magnetic anisotropy decreases its apparent, perpendicular magnetic anisotropy and thus decreases the coercive force. Further, the longitudinal magnetic film rotates its magnetization relatively easier through application of the magnetic field from the longitudinal direction, and the torque acting thereon becomes maximum when the angle is $(\pi/4)$ rad between the direction of magnetization and the direction of the magnetic field applied. When the magnetic field is applied from the direction inclined at the angle of $(\pi/4)$ rad to the exchange-coupled films as described above, the magnetization in the longitudinal magnetic film is rotated by the lower applied magnetic field, and the magnetization in the perpendicular magnetic film exchange-coupled therewith is readily reversed into the direction of the magnetic field applied in the perpendicular direction. This phenomenon becomes most prominent with application of the magnetic field from the direction inclined at $(\pi/4)$ rad from the easy axis of magnetization, but even with some deviation from this angle, it is feasible to reverse the magnetization by a weaker magnetic field than that upon application of the magnetic field only in the direction of easy magnetization. A method of applying the magnetic fields in this case can be a method of simultaneously applying the magnetic fields in the longitudinal direction and in the perpendicular direction and setting a ratio of intensities of the magnetic fields to 1, which permits application of the resultant magnetic field from the direction inclined at $(\pi/4)$ rad. Of course, a magnetic material may be positioned so as to apply the magnetic field from the direction inclined at $\pi/4$, or a conductor line may be arranged so as to apply the magnetic field from that direction.

It is also feasible to decrease the magnetization saturation magnetic field further, by stopping the application of the magnetic field in the longitudinal direction when the substantial reversal of the magnetization is achieved in the perpendicular magnetic film.

The above described the magnetic field applying methods for single-layer magnetic films and two-layer exchange-coupled films, but the magnetization reversal methods of the present invention are also valid for three or more-layer exchange-coupled films and also valid for multilayered films stacked through a nonmagnetic film like the magnetoresistive films or the like. Particularly, in the structure wherein the magnetic films are of multilayered structure and are magnetically coupled with each other, for example, in the case of a magnetoresistive film in which a layer with large coercive force and a layer with relatively small coercive force are stacked through a nonmagnetic layer, on the occasion of reversing the magnetization in the layer with the smaller coercive force, the magnetization reversal magnetic field might be apparently greater because of magnetic coupling force from the layer with the large coercive force. In such multilayered film structure, the magnetization reversal method of the present invention can be applied more effectively.

Figure 7A:
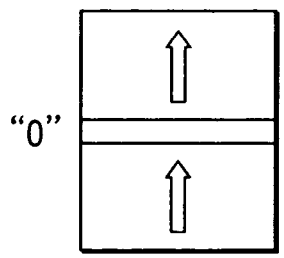
Figure 7B:
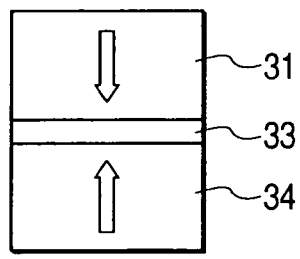
Figure 7C:
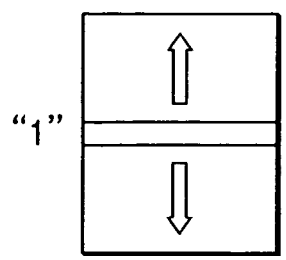
Figure 7D:
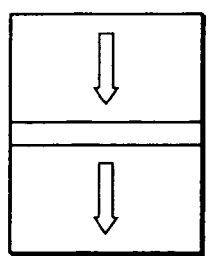

The magnetic field applied to the magnetic film may be a floating magnetic field from another magnetic material or may be a magnetic field created by supplying an electric current to a conductor line. However, in applications wherein the magnetoresistive film is used for memory devices in the MRAM or the like and the magnetic field is applied to the memory devices, it is preferable to utilize the magnetic field generated by supply of the electric current to conductor lines, i.e., write lines, because it is necessary to quickly reverse the directions of the magnetic field applied in the perpendicular direction. An example of an information recording/reproducing method of MRAM will be described briefly herein with reference to FIGS. 7A to 7D. By making use of such nature that the electric resistance of the magnetoresistive film is relatively small with magnetization directions of two magnetic layers 31, 34 being parallel but the electric resistance is relatively large with the magnetization directions being antiparallel, the magnetic layer 34 located below a nonmagnetic layer 33 is used as a recording layer, the magnetic layer 31 located above the nonmagnetic layer 33 as a readout layer, the downward magnetization direction in the recording layer is defined as "1", and the upward magnetization direction as "0". In the recording state of "0" the magnetic field is applied so as to make the magnetization direction upward in the readout layer and thereafter the magnetic field is applied so as to make the magnetization direction downward in the readout layer, whereupon the electric resistance of the magnetoresistive film changes to a larger value. Thus "0" can be read out from this change. However, the magnetic field applied during the readout should be set so as to be too weak to vary the magnetization direction in the recording layer. When the magnetization direction in the readout layer is upward and when the magnetization direction in the recording layer is downward as shown in FIG. 7C, the electric resistance is relatively large. When the magnetization directions in the two magnetic layers are downward as shown in FIG. 7D, the electric resistance is relatively small. Accordingly, when "1" is recorded, the execution of the reading operation results in varying the electric resistance to a smaller value and this enables readout of "1". By applying the above-stated magnetization reversal method to the memory devices used in the MRAM, it becomes feasible to decrease values of electric current necessary for the reversal of magnetization.

The magnetoresistive devices used in the MRAM can be constructed in such structure that the magnetic films have their respective magnetization reversal fields different from each other and in such setting of physical property values or the like that the magnetic film with the larger magnetization reversal field reverses its magnetization upon simultaneous application of the magnetic field in the direction of easy magnetization and in the same intensity as the magnetization reversal magnetic field of the magnetic film with the smaller magnetization reversal field, and the magnetic field inclined from the easy axis of magnetization, or in such setting of physical values that the magnetic film with the smaller magnetization saturation magnetic field reverses its magnetization upon application of the magnetic fields in the direction of easy magnetization and in the direction inclined from the easy axis of magnetization but the other magnetic film does not reverse its magnetization upon application of the foregoing magnetic fields. The details will be described in the embodiments described hereinafter.

Figure 31:
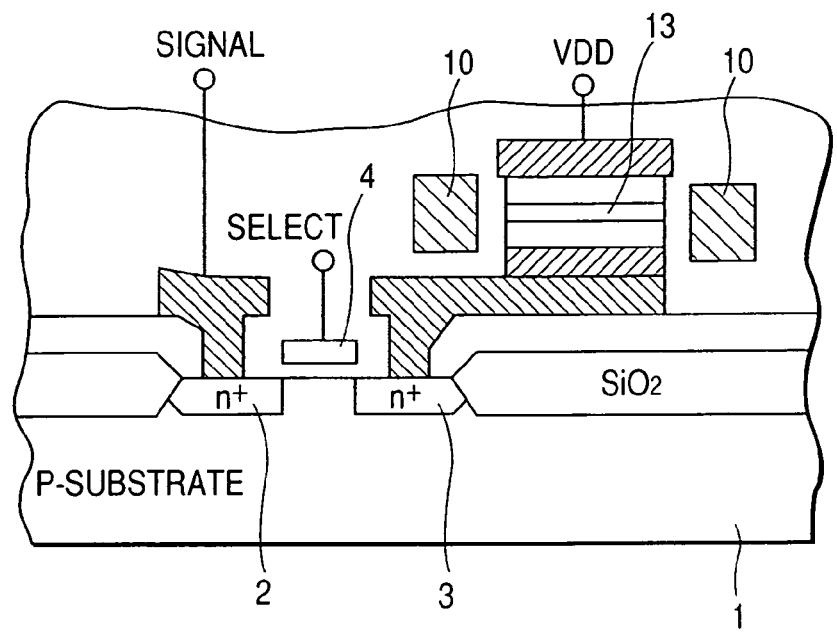
FIG. 31 is a view showing an example of the memory cell structure wherein the perpendicular magnetic films are used in the magnetoresistive film.

FIG. 31 shows a configuration example of memory cells in which the magnetoresistive film having the perpendicular magnetic films is used for memory devices. Numeral 1 designates a semiconductor substrate, 2 source regions, 3 drain regions, 30 memory devices (magnetoresistive film), 10 write lines, and 4 gate electrodes.

The preferred embodiments of the present invention will be described hereinafter. It is, however, noted that the present invention is by no means intended to be limited to these embodiments.

EMBODIMENTS

Embodiment 1

Figure 8:
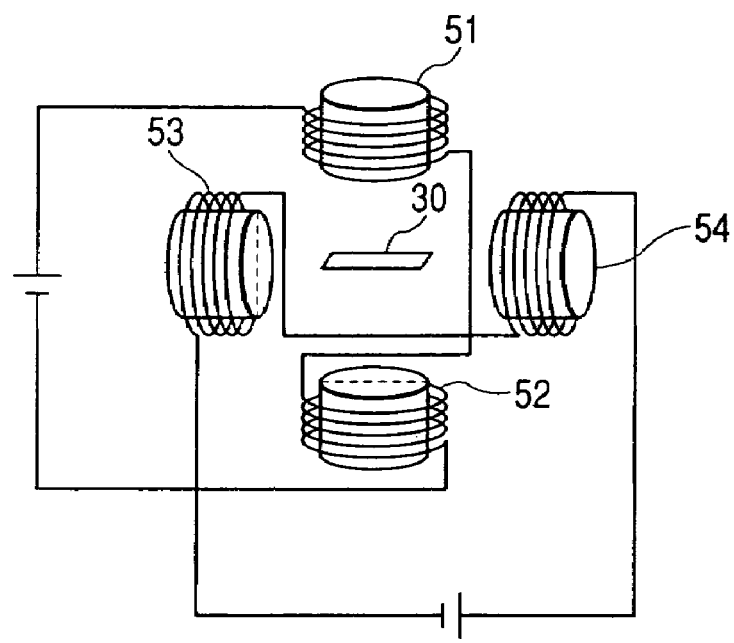
FIG. 8 is a schematic view showing a configuration of a system used in Embodiment 1.
Figure 9:
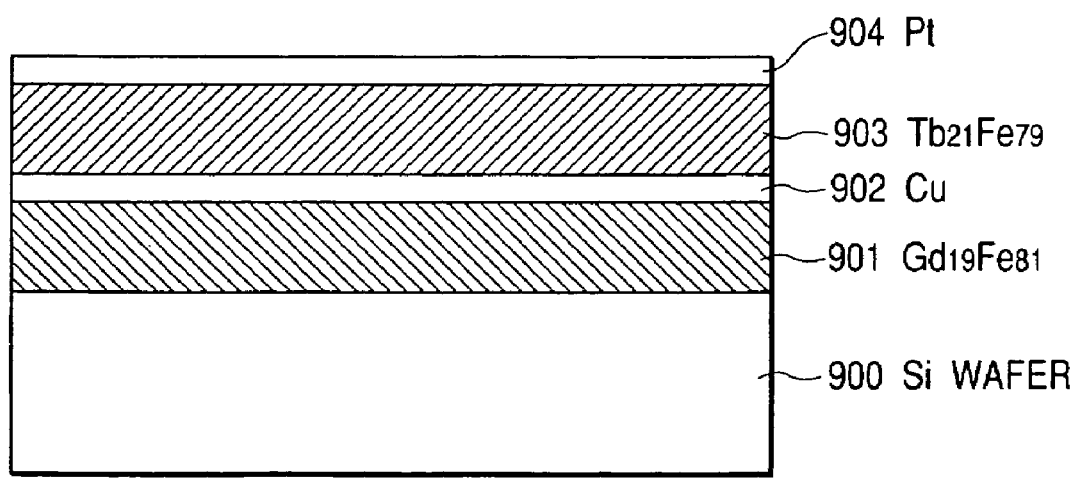
FIG. 9 is a schematic view showing a structure of magnetic films used in Embodiment 1.

FIG. 8 is a conceptual drawing to show a magnetization reversal method of the present embodiment. Electromagnets 51 to 54 are arranged above and below and left and right of a magnetoresistive film 30 having the structure in which a nonmagnetic film is placed between magnetic films having the easy axis of magnetization along the perpendicular direction, and magnetic fields are applied in the direction of easy magnetization, i.e., in the perpendicular direction and in a direction inclined from the easy axis of magnetization, i.e., in the longitudinal direction herein. The upper and lower electromagnets 51, 52 are connected to one power supply and generate a magnetic field in the same direction. The same also applies to the left and right electromagnets 53 and 54. FIG. 9 shows the film structure of the magnetoresistive film 30. The magnetoresistive film is deposited on an Si wafer 900 with an oxidized surface and consists of continuously deposited films of a $Gd_{19}Fe_{81}$ film 901 in the thickness of 20 nm, a Cu film 902 in the thickness of 5 nm, a $Tb_{21}Fe_{79}$ film 903 in the thickness of 20 nm, and a Pt film 904 in the thickness of 2 nm as a protective layer. The $Gd_{19}Fe_{81}$ film 901 and $Tb_{21}Fe_{79}$ film 903 are ferrimagnetic materials and the sublattice magnetization of Fe is dominant in the both films.

In each single layer, the magnetization saturation magnetic field of the $Gd_{19}Fe_{81}$ film 901 was 12 kA/m, and the magnetization saturation magnetic field of the $Tb_{21}Fe_{79}$ film 903 1.4 MA/m.

An unrepresented circuit is provided for measuring the electric resistance of the magnetoresistive film 30 by the series four-terminal method, to monitor states of magnetization reversal by change of the electric resistance. The intensity of the magnetic field applied in the perpendicular direction to the magnetoresistive film 30 can be varied in the range of 0 to 15 kA/m and the direction of application of the magnetic field can also be reversed. The intensity of the magnetic field applied in the direction inclined from the easy axis of magnetization, e.g., in the longitudinal direction is fixed at 4 kA/m and the direction of application thereof is also fixed.

Figure 10:
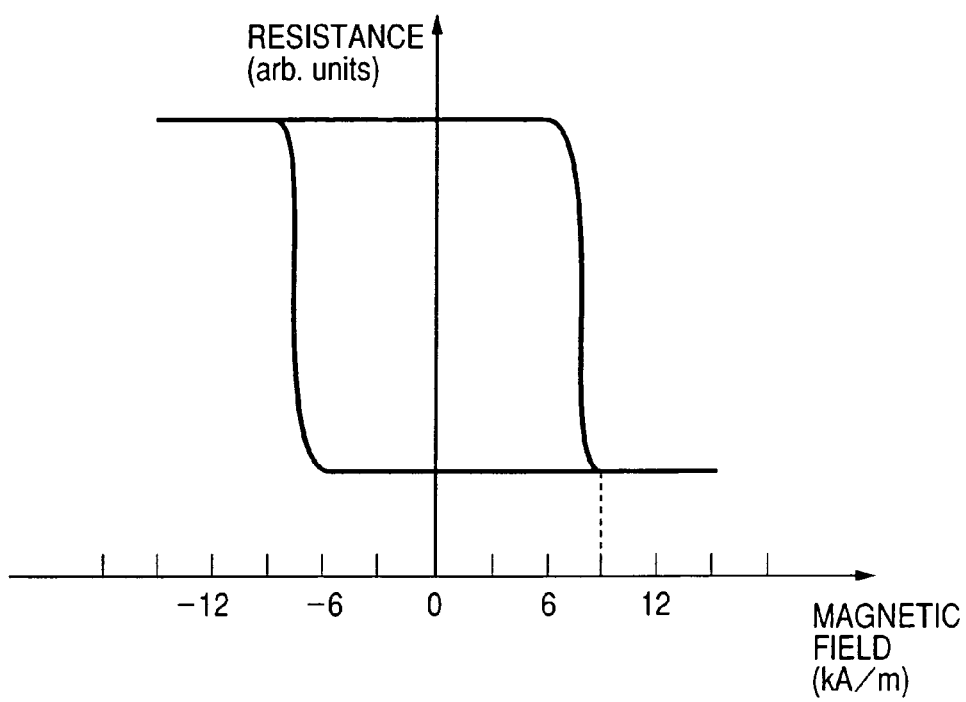
FIG. 10 is a diagram showing a magnetic resistance curve measured in Embodiment 1.

The magnetic field of 2 MA/m was first applied in the perpendicular direction to the magnetoresistive film 30 to align the magnetization in one direction. After that, the vertical magnetic field was applied in the range of 0 to 15 kA/m in the perpendicular direction while the magnetic field of 4 kA/m was applied in the longitudinal direction. This yielded a magnetic resistance curve shown in FIG. 10. Since the magnetization saturation field of the $Tb_{21}Fe_{79}$ film 903 is considerably large as 1.4 MA/m, the change of magnetic resistance is considered to be due to the reversal of magnetization in the $Gd_{19}Fe_{81}$ film 901. The magnetization saturation field of the $Gd_{19}Fe_{81}$ film 901 read from the magnetization curve was 12 kA/m, whereas that read from the magnetic resistance curve about 9 kA/m. It is thus seen that the magnetization saturation field is reduced by about 3 kA/m because of the application of the magnetic field in the longitudinal direction.

As described above, it is feasible to being the magnetization into saturation by the lower magnetic field in the case of the simultaneous application of the magnetic fields in the direction of easy magnetization and in the longitudinal direction than in the case of application of the magnetic field only in the direction of easy magnetization.

Embodiment 2

Figure 11:
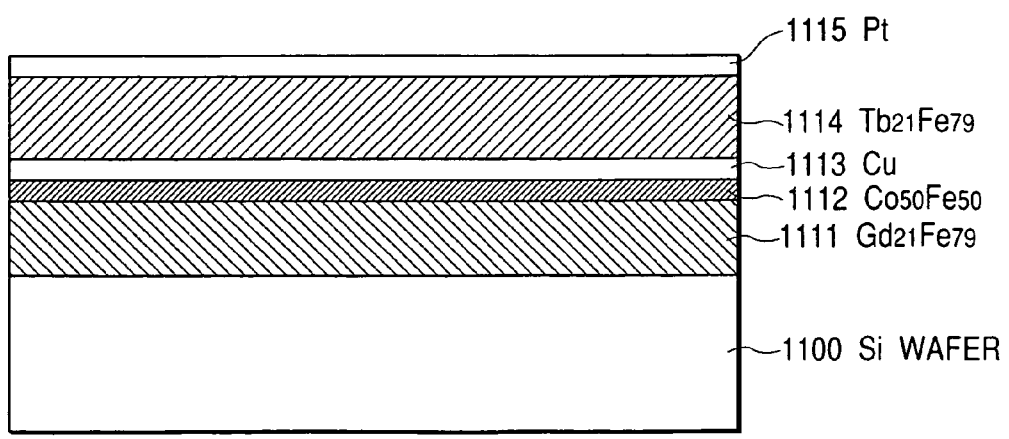
FIG. 11 is a schematic view showing a structure of magnetic films used in Embodiment 2.

FIG. 11 shows the film construction of the magnetic films in the present embodiment. The magnetoresistive film was made by continuously depositing a $Gd_{21}Fe_{79}$ film 1111 in the thickness of 50 nm, a $Co_{50}Fe_{50}$ film 1112 in the thickness of 1 nm, a Cu film 1113 in the thickness of 5 nm, a $Tb_{21}Fe_{79}$ film 1114 in the thickness of 20 nm, and a Pt film 1115 in the thickness of 2 nm as a protective layer on an Si wafer 1110 with an oxidized surface, and the magnetic resistance curve thereof was measured in the same manner as in Embodiment 1. The magnetic films 1111, 1114 herein have the direction of easy magnetization along the perpendicular direction. The $Gd_{21}Fe_{79}$ film 1111 is a ferrimagnetic material and the sublattice magnetization of Fe is dominant therein. The $Co_{50}Fe_{50}$ film 1112 is a magnetic film with greater longitudinal magnetic anisotropy than the $Gd_{21}Fe_{79}$ film 1111 and is exchange-coupled with the $Gd_{21}Fe_{79}$ film 1111. However, the magnetization of the $Co_{50}Fe_{50}$ film 1112 is directed along the perpendicular direction in the magnetic field of zero. The magnetization saturation magnetic field of the exchange-coupled films is 13 kA/m from the magnetization curve obtained upon application of only the magnetic field from the perpendicular direction.

Figure 12:
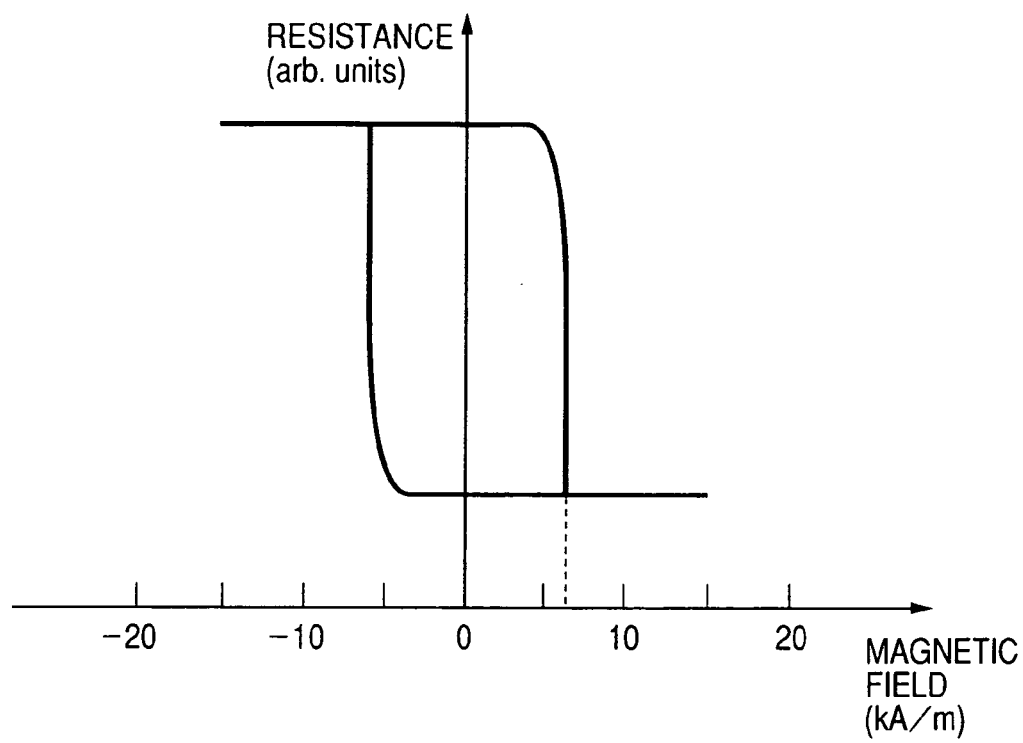
FIG. 12 is a diagram showing a magnetic resistance curve measured in Embodiment 2.

FIG. 12 shows the result of measurement to measure the magnetic resistance curve upon application of the magnetic fields in the perpendicular direction and in the longitudinal direction to the magnetic films in the same manner as in Embodiment 1. The applied magnetic fields were the magnetic field applied in the longitudinal direction and the magnetic field applied in the perpendicular direction. The resultant magnetic field was varied from $\pi/2$ to the final magnetic field applied only in the perpendicular direction. It is verified from the result of this measurement that the magnetization saturation field of the exchange-coupled films of the $Gd_{21}Fe_{79}$ film 1111 and the $Co_{50}Fe_{50}$ film 1112 is 6 kA/m and it is also seen that the magnetization is saturated by the lower magnetic field.

By applying the magnetic fields in the plurality of directions, i.e., applying the first magnetic field in the perpendicular direction and the second magnetic field in the longitudinal direction to the magnetic films and positively gradually decreasing the magnetic field from the direction making the greater angle to the direction of easy magnetization, i.e., the second magnetic field as in the present embodiment, it becomes feasible to decrease the magnetic field necessary for the reversal of magnetization more.

In the present embodiment the two magnetic fields were applied from the directions making the angle of $\pi/2$, i.e., from the perpendicular direction and the longitudinal direction, but the directions of the magnetic fields are not limited to this specific combination. There remains a portion affected by the magnetic field with the greater angle to the easy axis of magnetization even after the magnetization of the magnetic film has been directed to some extent in the perpendicular direction, as described previously, but it can be overcome by first stopping the application of the magnetic field with the greater, angle to the easy axis of magnetization and thereafter stopping the magnetic field with the smaller angle.

Embodiment 3

Figure 13:
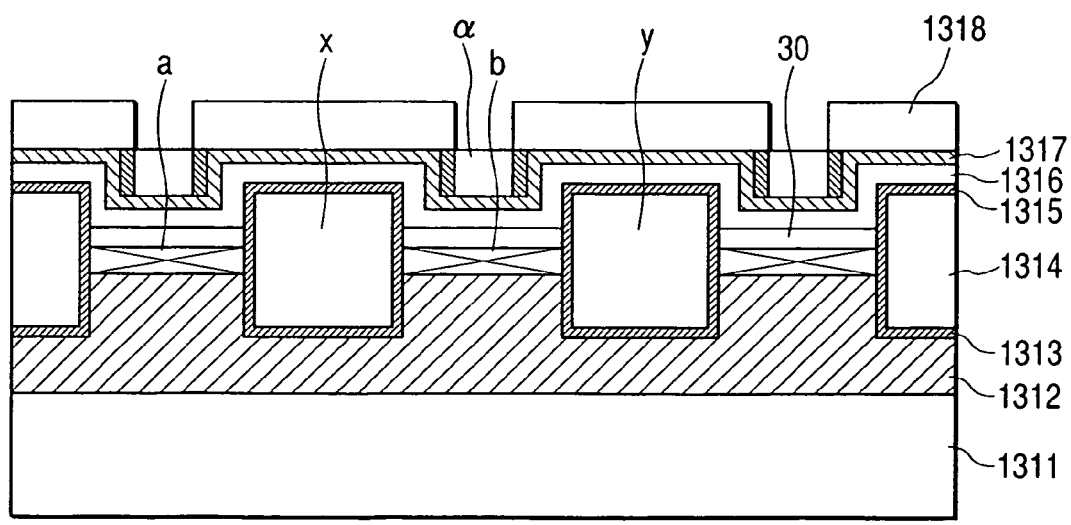
FIG. 13 is a view schematically showing memory devices described in Embodiment 3.
Figure 14:
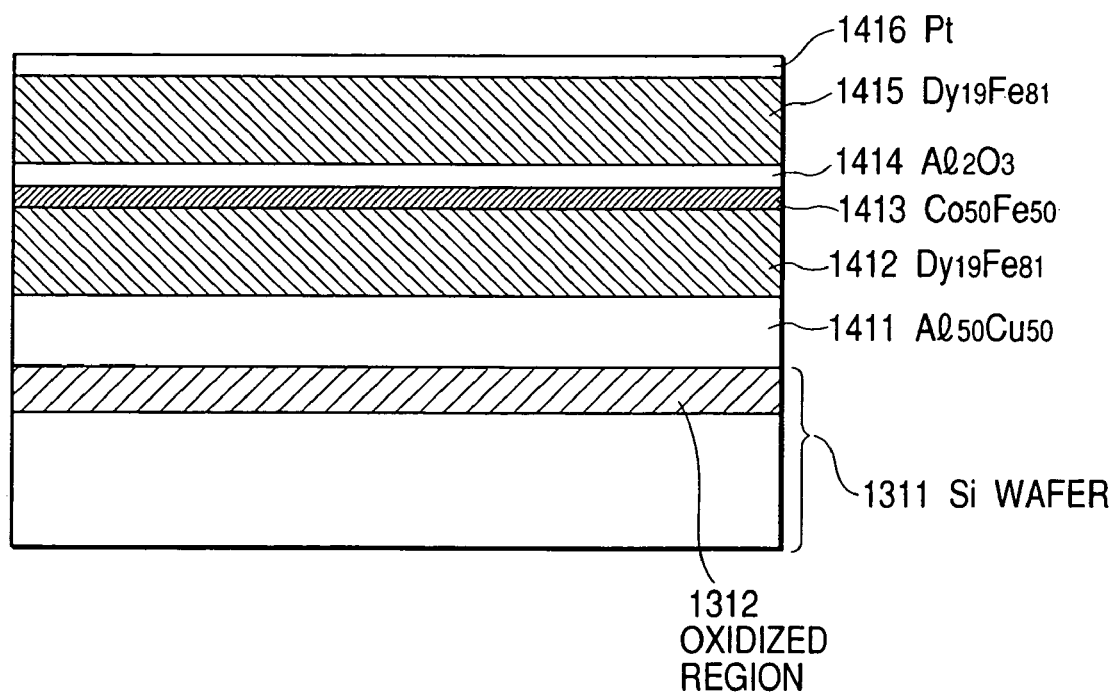
FIG. 14 is a schematic view showing a structure of magnetic films used in Embodiment 3.

The present embodiment presents a magnetization reversal method of the magnetic films in the MRAM. FIG. 13 is a cross-sectional view of a magnetic memory structure. FIG. 14 is a schematic diagram showing a cross section of the magnetoresistive film.

On an Si wafer 1311 with a surface oxidized to the depth of about 1 μm, the magnetoresistive film is made by continuously depositing an $Al_{50}Cu_{50}$ wiring layer 1411 in the thickness of 25 nm as a lower electrode, a $Dy_{19}Fe_{81}$ film 1412 in the thickness of 30 nm and a $Co_{50}Fe_{50}$ layer 1413 in the thickness of 1 nm as a detection layer, an $Al_2O_3$ film 1414 in the thickness of 2 nm, a $Dy_{19}Fe_{81}$ film 1415 in the thickness of 10 nm as a recording layer, and a Pt film 1416 in the thickness of 5 nm as a protective layer. A resist film is formed in a desired shape on the magnetoresistive film and dry etching is carried out several times to form a plurality of devices a, b, c of the magnetoresistive film and etch the $SiO_2$ film 1312 partially to the depth of 0.5 μm. After that, an $Al_2O_3$ film 1313 is deposited as an insulating layer in the thickness of 100 nm and, subsequent thereto, an Al film 1314 is deposited as wiring lines for generating the magnetic field in the perpendicular direction, in the thickness of 1 μm. Then removed are the resist formed over the devices and the $Al_2O_3$ film and Al film deposited thereon. Then the exposed surfaces of the Al films are oxidized by plasma oxidation to form $Al_2O_3$ insulating films 1315. After that, an Al upper electrode 1316 is made by the lift-off method and the surface thereof is covered by $Al_2O_3$ insulating film 1317. Further, Al lines 1318 are formed in the thickness of 0.5 μm as lines for generating the magnetic field in the longitudinal direction, by the lift-off method.

The area of each device produced was 1 μm×1 μm and the width of the Al lines being the write lines for generating the magnetic field was 1 μm. When the electric current is supplied in the current density of 50 mA/μm² to the Al wires for applying the magnetic field, the magnetic field of about 3.5 kA/m is applied in the perpendicular direction from one line to each device and the magnetic field of about 6 kA/m is applied thereto in the longitudinal direction.

Let us explain a method of reversing the magnetization while selecting only the magnetic film of the device b. Electric currents of opposite directions are supplied to the Al lines x and y so that the magnetic field of the same direction is applied to the device b in the perpendicular direction, i.e., in the direction of easy magnetization from the plurality of magnetic field applying means. For example, let us suppose that at this time the magnetic field in the intensity of 2 Hn is applied to the device in the perpendicular direction. At the same time as it, an electric current is supplied to the Al line α to apply the magnetic field in the intensity Hi in the longitudinal direction to the device b. In this setting there is no device except for the device b to which the magnetic field in the intensity of Hi in the longitudinal direction and the magnetic field in the intensity of 2 Hn in the perpendicular direction are applied simultaneously. Accordingly, the magnetization can be reversed in only the magnetic film of the device b by appropriately selecting the intensities of these magnetic fields, which permits a specific memory device to be selected.

In the present embodiment there were the new conductor lines for the magnetic field applied in the longitudinal direction, but other lines, e.g., bit lines or the like can also be used as the conductor lines for the longitudinal magnetic field in the case of the MRAM. This configuration is preferable, because the devices can be constructed in compact size and the fabrication process is also simpler. When the lines between the memory devices are shared between adjacent devices, the devices can be constructed in more compact size.

Embodiment 4

Figure 15:
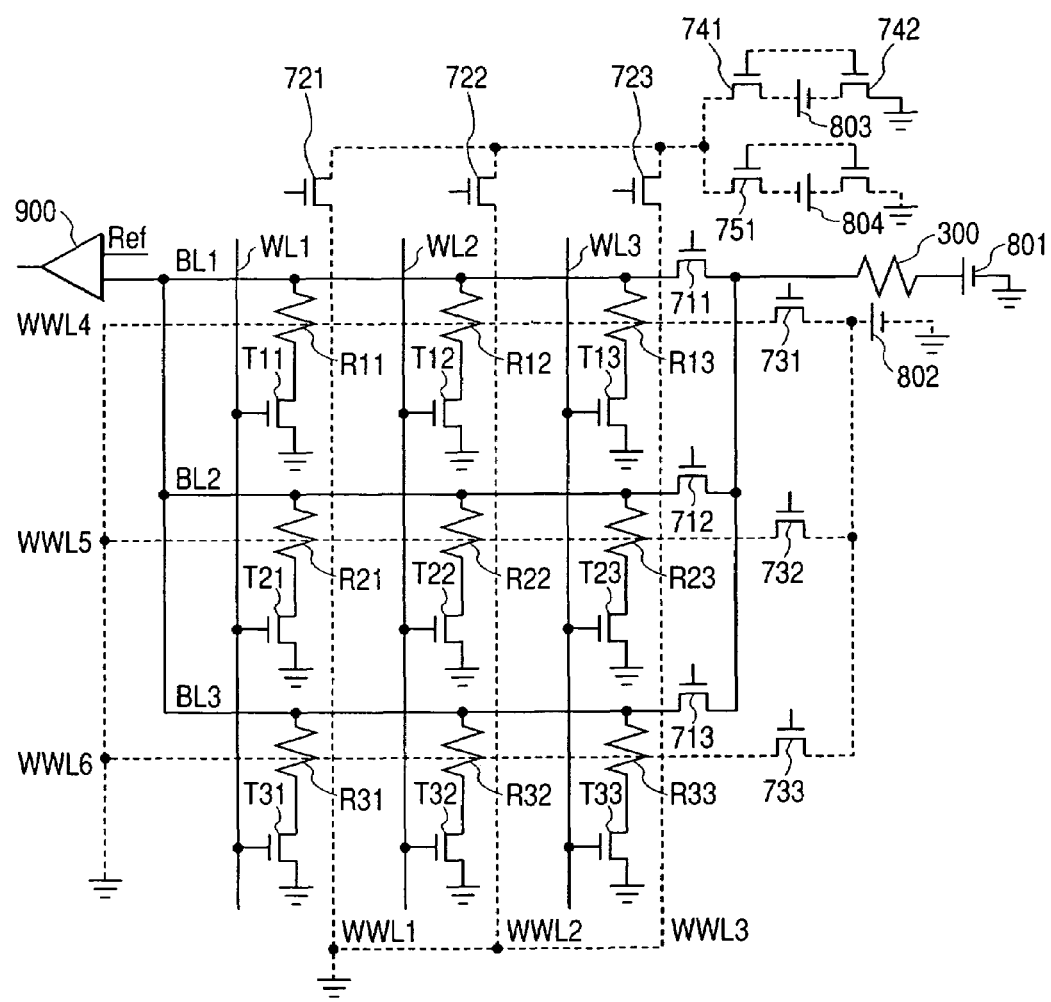
FIG. 15 is an equivalent circuit diagram of a memory described in Embodiment 4.
Figure 16:
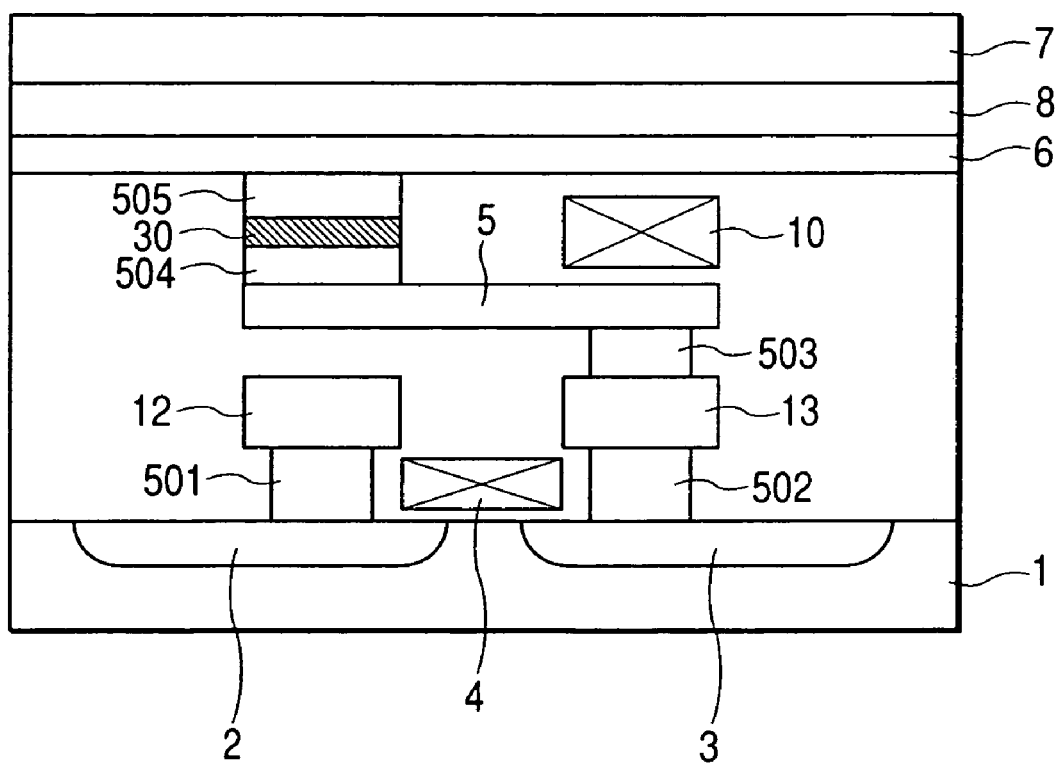
FIG. 16 is a view schematically showing a region around one device in the memory described in Embodiment 4.

The present embodiment illustrates the MRAM in which the memory devices (magnetoresistive film) used in Embodiment 3 are arrayed in a matrix of three rows and three columns. FIG. 15 is an equivalent circuit diagram of the present embodiment. R11 to R33 denote the memory devices arrayed in the matrix and T11 to T33 transistors. Solid lines indicate a circuit for detecting change in resistance of the magnetoresistive film and dashed lines a circuit for generating the magnetic fields applied to the memory devices. FIG. 16 is a cross-sectional view schematically showing a portion around one device. Numeral 1 designates a substrate, 10 a write line for applying the magnetic field in the perpendicular direction, 4 a gate electrode, 12 a source electrode, 13 a drain electrode, 2 a source region, 3 a drain region, 5 a local line, and 6 a bit line. Numerals 501 to 505 represent contact plugs, 7 a write line for applying the magnetic field in the longitudinal direction, 8 an insulating film, and 30 a memory device.

Let us describe below a method of selectively reversing the magnetization in any desired device in this MRAM. Here an electric current supplied from power supply 802 generates the magnetic field applied in the direction inclined from the easy axis of magnetization to the magnetoresistive film, which is preferably the longitudinal direction. An electric current supplied from power supply 803 and power supply 804 generates the magnetic field applied in the direction of easy magnetization, i.e., in the perpendicular direction to the memory devices. Let us explain a case of selectively reversing the magnetization in the memory device R22, for example. In order to apply the magnetic field in the longitudinal direction to the memory device R22, a transistor 732 is switched on. As seen from the figure, the magnetic field is also applied in the same intensity and in the longitudinal direction to the memory device R21 and to the memory device R23 at the same time as it. Further, a transistor 722 is switched on to apply the magnetic field in the perpendicular direction to the memory device R22. The magnetic field is also applied in the same intensity and in the perpendicular direction to the memory device R12 and to the memory device R32 at the same time as it. It is, however, necessary to change the direction of the magnetic field applied in the perpendicular direction, depending upon to which direction the magnetization is directed in the magnetoresistive film. This is achieved by changing the polarity of the voltage applied to this conductor line. For example, transistor 741 and transistor 742 are switched on for applying the magnetic field in the perpendicular downward direction, whereas transistor 751 and transistor 752 are simultaneously switched on for applying the magnetic field in the perpendicular upward direction. Through the above operation the magnetic fields are applied both in the longitudinal direction and in the perpendicular direction to only the memory device R22. On this occasion, it becomes feasible to apply the magnetic field in an arbitrary intensity from an arbitrary direction, by properly changing the value of electric current in the conductor line for applying the magnetic field in the perpendicular direction and the value of electric current in the conductor line for applying the magnetic field in the longitudinal direction. For example, an application way is such that the magnetic field in the longitudinal direction is first applied, the intensity of the magnetic field in the perpendicular direction is gradually increased to change the direction of the resultant magnetic field from the direction of $\pi/2$ gradually to the perpendicular direction relative to the longitudinal direction, i.e., the direction of easy magnetization of the perpendicular magnetic film, and the application of the magnetic field in the longitudinal direction is finally stopped, thereby applying the magnetic field only in the perpendicular direction. Smooth reversal of magnetization is achieved by gradually changing the direction of the resultant magnetic field, so as to enable decrease of the magnetization reversal magnetic field, thereby making it feasible to decrease the electric current values supplied to the lines and achieve power saving of the magnetic memory.

A means for changing the intensity and direction of the resultant magnetic field herein is one for controlling intensities or application times of the magnetic fields in the direction of easy magnetization and in the direction inclined therefrom, so as to be able to control the intensity and direction of the resultant magnetic field readily. For example, in FIG. 15, such means can be a circuit for controlling the timing when the transistors 721 to 723, 731 to 733 are switched on, or a configuration wherein the supply voltage, which is constant in the figure, is configured as a variable power supply and there is provided a circuit for controlling the voltage thereof.

However, concerning the magnetization reversal in recording/reproduction of information in the MRAM and the like, if the memory is provided with the means for varying the intensities and directions of the magnetic fields on occasions to be applied, peripheral circuitry can become complicated. Accordingly, there is no need for change in the intensities and directions of the magnetic fields positively in this case, and it is preferable in such case to set the physical property values etc. of the memory devices so as to select a specific memory device by simultaneously applying the magnetic fields in the direction of easy magnetization and in the direction inclined from the easy axis of magnetization.

When the magnetizations of the magnetic films above and below the nonmagnetic film in the magnetoresistive film are such that the direction of the magnetization is fixed in one magnetic film and the direction of the magnetization in the other magnetic film can be reversed by the magnetic field applied thereto, the magnetization in one magnetic film is reversed by the magnetic field in the perpendicular direction, i.e., in the direction of easy magnetization and the magnetic field in the longitudinal direction, and the magnetization in the other layer is not reversed by these magnetic fields. In this configuration, the magnetization reversal is effected in only the memory device R22 by the above-stated magnetic field applying method. When the devices are made of the magnetoresistive film of the coercive force difference type and when the readout layer with the relatively low coercive force is one the magnetization of which can be reversed by only the magnetic field applied in the perpendicular direction, the magnetization of the readout layer is also reversed in the memory device R12 and in the memory device R32, in addition to the memory device R22, by the above operation. However, the reversal in the recording layer occurs only in the memory device R22. Namely, information is recorded only in the memory device R22, which results in enabling selection of a specific memory device.

In the case of the magnetoresistive film of this type, the magnetic field applied during readout can be only one in the perpendicular direction. Further, in the case wherein the magnetization reversal of the readout layer in the magnetoresistive film necessitates application of the magnetic fields both in the longitudinal direction and in the perpendicular direction, the magnetization reversal occurs only in the memory device R22, and, in order to prevent the reversal of magnetization in the recording layer during readout, the voltage of the power supply 803 and the power supply 804 or the voltage of the power supply 802 should be set preferably smaller than those during recording, thereby decreasing the intensities of generated magnetic fields. In this case, physical property values are preferably set so that the magnetization of one magnetic film is reversed by the magnetic field in the direction of easy magnetization and the magnetization of the other magnetic film is reversed by the magnetic field in the direction of easy magnetization and the magnetic field in the longitudinal direction.

The readout operation will be described below. For example, for reading information recorded in the memory device R22, the transistor 712 and transistor T22 are switched on. This establishes a circuit in which the power supply 801, fixed resistor 300, and memory device R22 are connected in series. Accordingly, the supply voltage is divided into the respective resistors at a rate of the resistance of the fixed resistor 300 and the resistance of the memory device R22. Since the supply voltage is fixed, change in the resistance of the magnetoresistive film results in varying the voltage applied to the magnetoresistive film according to the change. Values of the voltage are read by sense amplifier 900. There are two principal readout methods herein. The first method is a method of detecting the magnitude of the voltage applied to the magnetoresistive film and discriminating information by the magnitude, which will be referred to as absolute detection. The second method is a method of changing only the direction of magnetization in the readout layer of the magnetoresistive film and discriminating information by a difference between changes of the voltages appearing thereupon. Suppose the voltage value is, for example, decreased upon reversal of magnetization in the readout layer, this decrease is defined as "1". An increase of the voltage value on the other hand is defined as "0". This readout method is referred to as differential detection.

It is a matter of course that either of the readout methods may be applied to the magnetization reversal methods of the present invention. The MRAM of the present embodiment can be driven by small power as described above.

Embodiment 5

Figure 17:
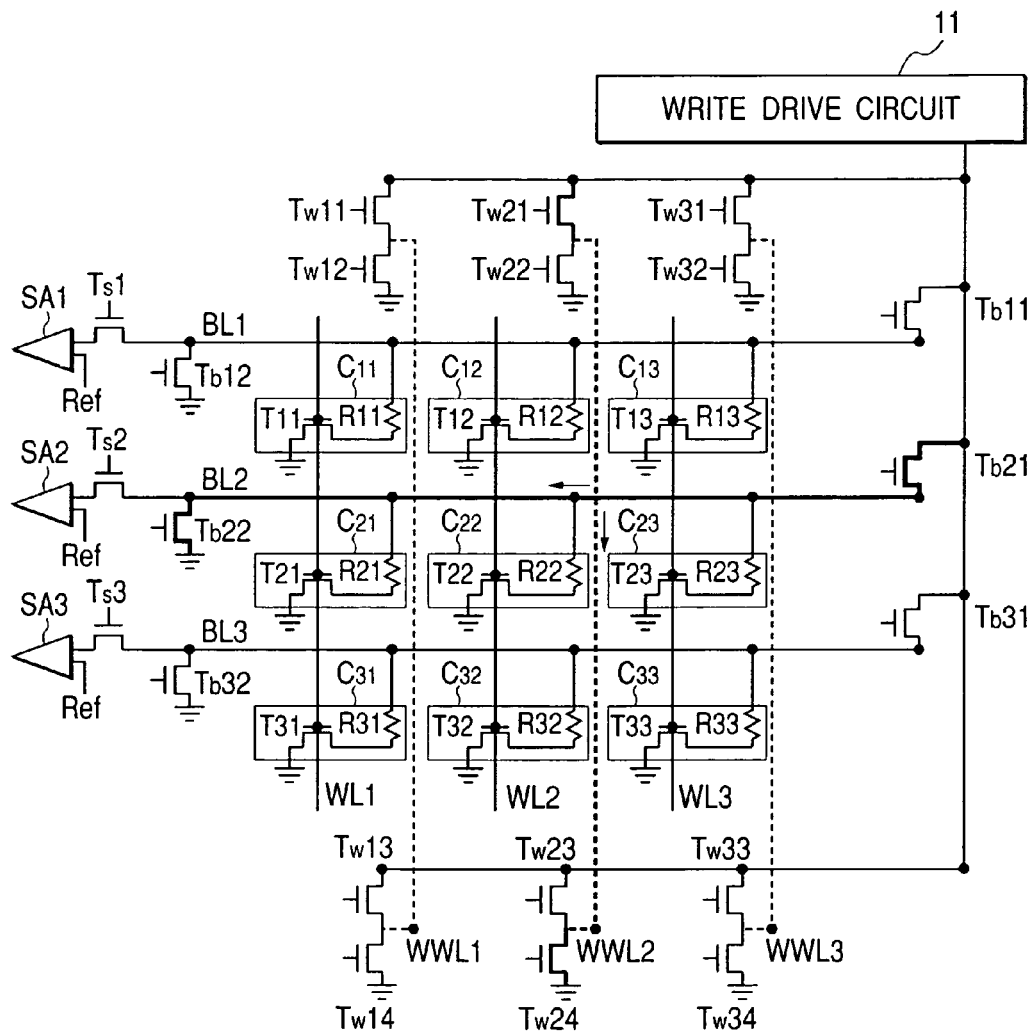
FIG. 17 is an equivalent circuit diagram showing a configuration of a region mainly associated with storage of information in the MRAM of Embodiment 5.

In the present embodiment the MRAM using the perpendicular magnetic TMR devices will be described below in detail. FIG. 17 is a circuit diagram showing the structure of the part mainly associated with storage of information in the MRAM of the present embodiment. The MRAM of the present embodiment incorporates memory cells C11 to C13, C21 to C23, C31 to C33 arrayed in a matrix pattern of 3×3, bit lines BL1 to BL3 being second write lines for both reading and writing, word lines WL1 to WL3 for reading, and write lines WWL1 to WWL3 being first write lines. The bit lines BL1 to BL3 are routed in parallel to each other and one for each row of memory cells. The word lines WL1 to WL3 are parallel to each other, perpendicular to the bit lines BL1 to BL3, and routed one for each column of memory cells. The write lines WWL1 to WWL3 are parallel to each other, parallel to the word lines WL1 to WL3, and routed one for each column of memory cells. The write lines WWL1 to WWL3 and the bit lines BL1 to BL3 are routed so as to be perpendicular to each other and electrically insulated at intersecting points by an insulating layer.

Each of the memory cells C11 to C33 has a corresponding field effect transistor T11 to T33 and a corresponding TMR element r11 to r33 the electrical resistance of which varies based on selection of the magnetization direction of the ferromagnetic material. The TMR elements r11 to r33 are perpendicular TMR elements of such structure that a thin aluminum oxide film 0.5 to 2 nm thick is placed between two layers of ferrimagnetic materials having the easy axis of magnetization along the perpendicular direction (the direction of thickness). The ferrimagnetic materials having the easy axis of magnetization along the perpendicular direction (thickness) can be selected from materials containing either of gadolinium (Gd), terbium (Tb), and dysprosium (Dy), e.g., GdFe, GdFeCo, TbFeCo, DyFe, DyFeCo, and so on. In the TMR elements r11 to r33, information to be stored is determined by the magnetization direction of a memory layer, which is one of the two magnetic layers. Since the magnetization direction of the memory layer is retained without application of an external magnetic field over the reversal magnetic field, the TMR elements r11 to r33 act as nonvolatile memories. Since each of the TMR elements r11 to r33 has different resistances between in a state in which the magnetization directions of the two magnetic layers are equal (parallel) and in a state in which the magnetization directions are opposite (antiparallel), stored information is read out by detecting the difference between values of tunneling current flowing through the aluminum oxide film.

In the memory cell C11, the drain of the field effect transistor T11 is connected to one terminal of the TMR element r11. Likewise, in the memory cells C12 to C33, the drain of the corresponding field effect transistor T12 to T33 is connected to one terminal of the corresponding TMR element r12 to r33. The other ends of the TMR elements r11, r12, r13 are connected to the bit line BL1. Likewise, the other terminals of the TMR elements r21, r22, r23 are connected to the bit line BL2, and the other terminals of the TMR elements r31, r32, r33 to the bit line BL3.

The gate terminals of the field effect transistors T11, T21, T31 are connected to the reading word line WL1, while the source terminals thereof are grounded. Likewise, the gate terminals of the field effect transistors T12, T22, T32 are connected to another reading word line WL2, and the gate terminals of the field effect transistors T13, T23, T33 are connected to still another reading word line WL3, the source terminals of those transistors being grounded.

For supply of electric current in two ways, each of the write lines WWL1 to WWL3 is provided with a drive circuit connected thereto and composed of four field effect transistors Tw11 to Tw14, Tw21 to Tw24, Tw31 to Tw34. For supply of electric current during writing, each of the bit lines BL1 to BL3 is provided with a drive circuit connected thereto and composed of two field effect transistors Tb11 to Tb12, Tb21 to Tb22, Tb31 to Tb32, and a sense amplifier SA1, SA2, SA3 used during readout is connected to each bit line through a field effect transistor Ts1, Ts2, or Ts3. A reference potential is supplied to the other input of each sense amplifier SA1, SA2, SA3.

The field effect transistors Tw11 to Tw14, Tw21 to Tw24, Tw31 to Tw34 are switching devices. When the field effect transistors opposite to each other (e.g., Tw21 and Tw24) are simultaneously switched on, an electric current can be made to flow in a corresponding write line (WWL2 in the case of Tw21 and Tw24), and this electric current makes an electric field applied in the perpendicular direction to the TMR elements (e.g., r22).

The field effect transistors Tb11 to Tb12, Tb21 to Tb22, Tb31 to Tb32 are also switching devices. When the field effect transistors connected to a common bit line (e.g., Tb21 and Tb22) are simultaneously switched on, an electric current can be made to flow in the bit line (BL2 in the case of Tb21 and Tb22), and this electric current makes an electric field applied in the longitudinal direction to the TMR elements (e.g., r22). The above operation makes the reversal of magnetization feasible in the memory layer of the TMR element to which the perpendicular and longitudinal magnetic fields are simultaneously applied, thus enabling storage of information, i.e., the writing operation. The circuitry described above is formed on a semiconductor substrate.

The magnetic thin film memory device of the present embodiment is provided with a write drive circuit 11 being a control means for supplying the write current to the bit lines BL1 to BL3 and to the write lines WWL1 to WWL3, in addition to the above configuration. The write drive circuit 11 drives the field effect transistors Tw11 to Tw14, Tw21 to Tw24, Tw31 to Tw34, Tb11 to Tb12, Tb21 to Tb22, Tb31 to Tb32 being the switching devices, so as to enable the above-stated writing operation.

Figure 18:
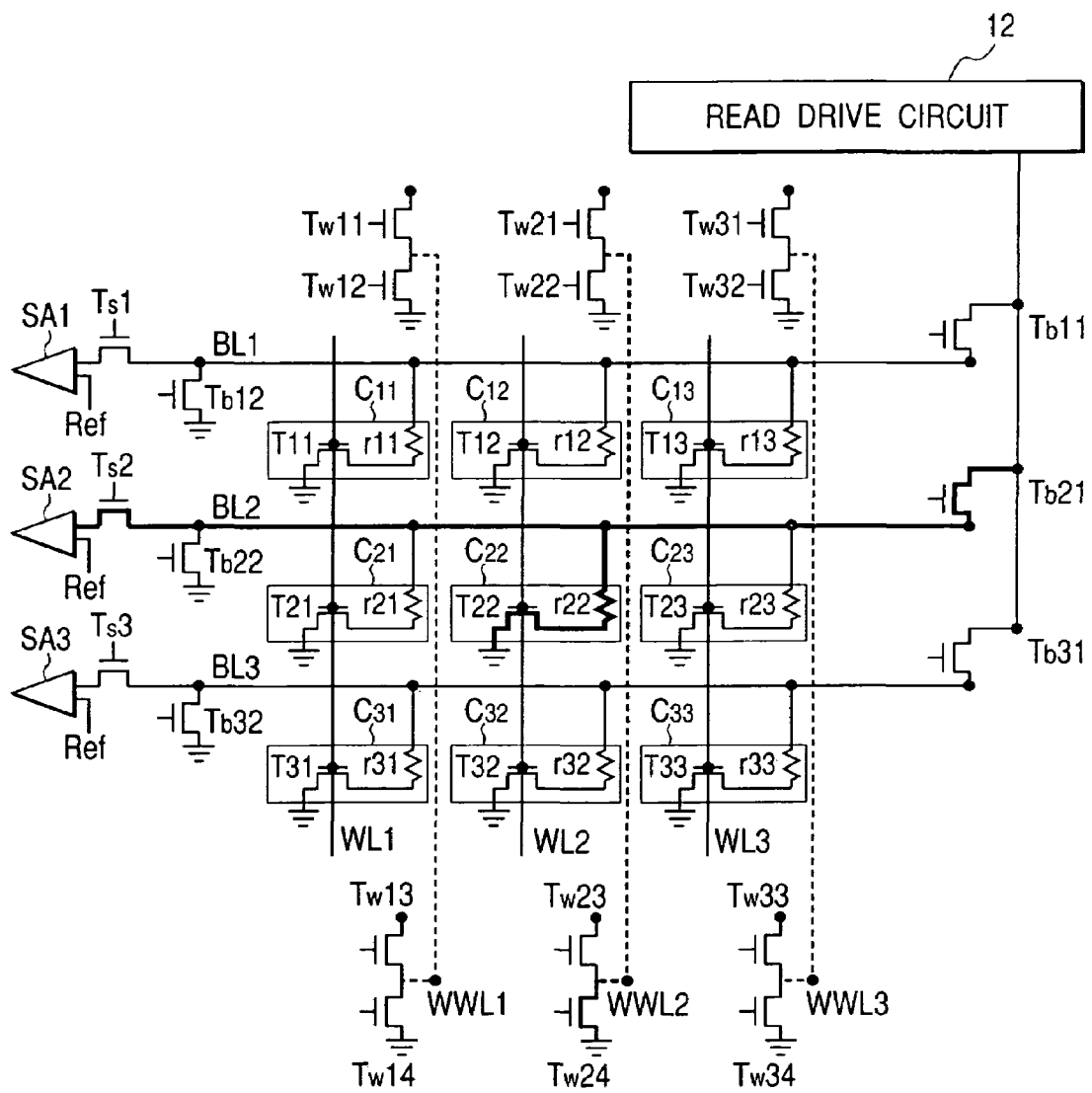
FIG. 18 is an equivalent circuit diagram showing a configuration of a region mainly associated with readout of information in the MRAM of Embodiment 5.

FIG. 18 is a circuit diagram showing the structure of the part mainly associated with the readout of information from the magnetic thin film memory device of the present embodiment. Described below is the operation for reading the information stored in the memory cell C22.

A reading drive circuit 12 turns the field effect transistor Tb21 on and turns the field effect transistors Ts2, Tb22 connected to the sensor amplifier SA2, off, thereby applying a fixed voltage through Tb21 to the bit line BL2. In this state a voltage is applied to the reading word line WL2 to turn the device-selecting transistors T12 to T32 on, whereupon an electric current flows through the TMR element r22 to lower the potential of the bit line BL2. An amount of this potential drop is determined by the on-state resistance of the field effect transistor Tb21, the resistance of the TMR element r22, and the on-state resistance of the transistor T22 and is thus dependent upon the resistance of the TMR element r22.

By switching the field effect transistor Ts2 on, the potential of the bit line BL2 is supplied to the sense amplifier SA2 to be compared with the reference potential Ref.

A state in which the potential of the bit line BL2 is higher than the reference potential Ref means that the magnetization directions of the two magnetic layers constituting the TMR element are antiparallel, whereas a state in which the potential of the bit line BL2 is lower than the reference potential Ref means that the magnetization directions of the two magnetic layers constituting the TMR element are parallel. As described above, the bit lines BL1 to BL3 being the second write lines are also used as the read lines.

Figure 19:
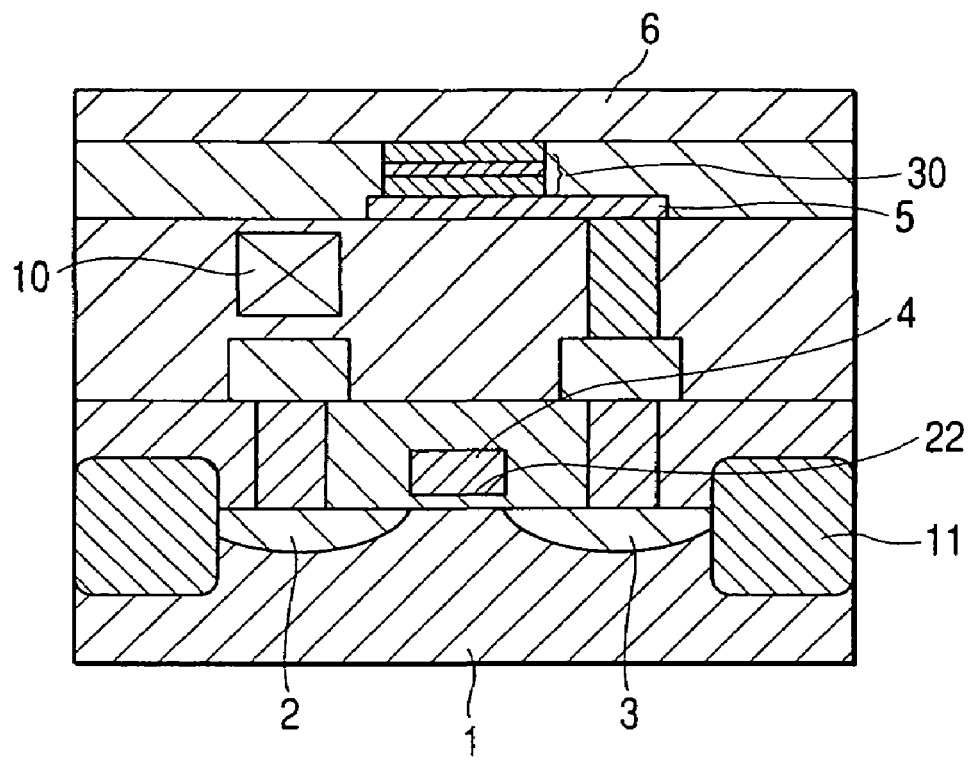
FIG. 19 is a schematic view showing the structure of the MRAM in Embodiment 5.

FIG. 19 is a cross-sectional view showing the structure of the magnetic thin film memory device of the present embodiment. As shown in FIG. 19, formed on a p-type silicon substrate 1 are buried device isolating regions 11 of $SiO_2$, n-type diffusion regions 2 (sources) and 3 (drains) of the field effect transistors T11 to T33 functioning as switching devices, gate insulating films 22 of $SiO_2$, and gate electrodes 4 of polysilicon. Further provided thereon are the write lines 10, local lines 5, TMR films 30, and bit lines 6. The gate electrodes 4 of polysilicon are connected to either of the word lines WL1 to WL3 shown in FIG. 17.

The TMR film 30 corresponds to either of the TMR elements r11 to r33 of FIG. 17, the bit line 6 to either of the bit lines BL1 to BL3 of FIG. 17, and the write line 10 to either of the write lines WWL1 to WWL3. The local line 5 is made of TiN and connects the drain of the field effect transistor to one terminal of the TMR layer 30. The bit line 6 is made of Ti/AlSiCu/Ti.

The write line 10 is disposed in the vicinity of the TMR layer 30 and a little below the TMR layer 30. Namely, the write line 10 is routed at a position where it does not overlap with the TMR layer 30 in the stack direction of the TMR layer 30 and in parallel to the longitudinal direction of the TMR layer 30. When an electric current is made to flow in either of two ways through the write line 10, an upward or downward magnetic field is applied to the TMR layer 30.

Since the bit line 6 is routed immediately above the TMR layer 30 and in parallel to the longitudinal direction of the TMR layer 30, an electric current flowing in the bit line 6 generates a magnetic field in the longitudinal direction to the TMR element. Namely, the write line 10 is routed so as to be closer to the p-type silicon substrate 1 than the bit line 6.

During storage of information, the longitudinal magnetic field is applied simultaneously with the magnetic field generated by the write line 10, whereby the memory layer of the TMR film 4 is magnetized in the direction of the magnetic field generated by the electric current flowing in the write line 10. The direction of the longitudinal magnetic field can be arbitrarily selected from those in the plane of the TMR layer 30. Accordingly, a condition to be met herein is that the longitudinal magnetic field is always generated in a fixed direction, regardless of the direction of the magnetic field generated by the electric current flowing in the write line 10.

Namely, the electric current to be supplied to the bit line 6 is the electric current of one direction and thus the drive circuit connected to the bit line 6 can be constructed in the simplified form consisting of only two field effect transistors, as shown in FIG. 17. During the readout of information, the field effect transistor is turned on to make the electric current flow through the bit line 6 to the TMR layer 30, whereby the potential of the bit line 6 is lowered to a level according to the resistance of the TMR layer.

In the MRAM of the present embodiment, as described above, the perpendicular magnetic field and the longitudinal magnetic field are simultaneously applied to the perpendicular TMR element on the occasion of writing information in the perpendicular TMR element comprised of the magnetic layers having the easy axis of magnetization along the perpendicular direction. For that reason, the magnitude of the electric current flowing in the write line can be largely decreased. By also using one of two write lines as a read line, the number of lines necessary for driving of a memory cell can be reduced from 4 to 3. Further, since the direction of the longitudinal magnetic field can be always fixed in one direction, the structure of the drive circuit for generating the longitudinal magnetic field can be simplified.

There are two conceivable settings as to physical property values of the magnetic films in the magnetoresistive film herein. In one setting, the magnetization reversal magnetic fields of the magnetic layers placed on the both sides of the nonmagnetic film are made different from each other, the film with the larger magnetization reversal field is set so as to reverse the magnetization by applying the magnetic fields made by the write line and the bit line, and the other film is set so as to reverse the magnetization by applying only the magnetic field made by the write line. In the other setting, the film with the greater magnetization reversal field is set so as not to reverse the magnetization, but only the other film is set so as to reverse the magnetization, during the writing operation by the write line and bit line. The former can be used in the both absolute detection and differential detection and is effective, particularly, in the differential detection, and the latter is effective in the absolute detection.

Figure 20:
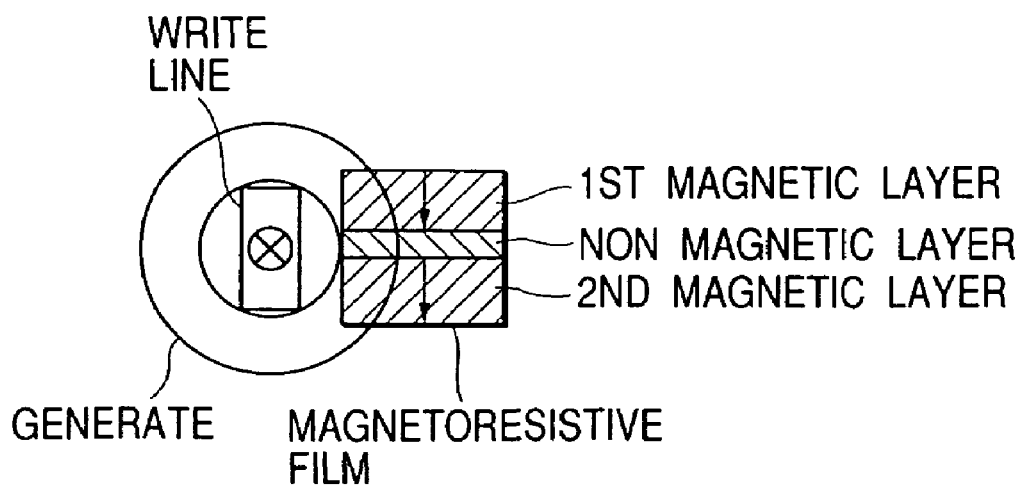
FIG. 20 is a schematic view showing a positional relation between a write line and a memory cell.

Although the MRAM of the present embodiment was arranged in such structure that the bit line 6 was placed immediately above the TMR layer 30 and the write line 10 below the bottom surface of the lower magnetic layer of the TMR layer 30, the locations thereof can be determined without having to be limited to those positions; e.g., the bit line 6 may be located immediately below the TMR layer 30 and the write line 10 may be located above the upper surface of the upper magnetic layer of the TMR layer 30. In order to apply the magnetic field efficiently to the TMR element, the write line 10 is desirably routed on the same plane as the TMR layer 30 if it satisfies restrictions on the layout of the memory cells, as shown in FIG. 20.

Embodiment 6

Figure 21:
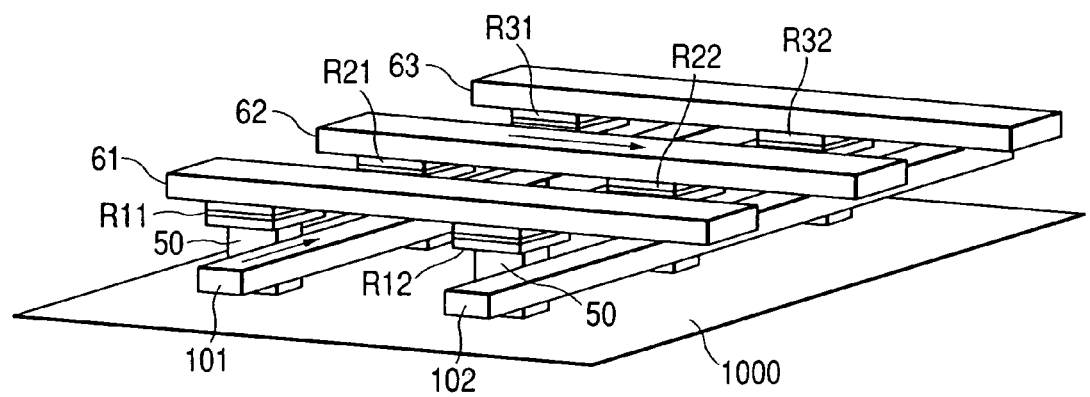
FIG. 21 is a perspective view showing an example of the MRAM structure in Embodiment 6.
Figure 22:
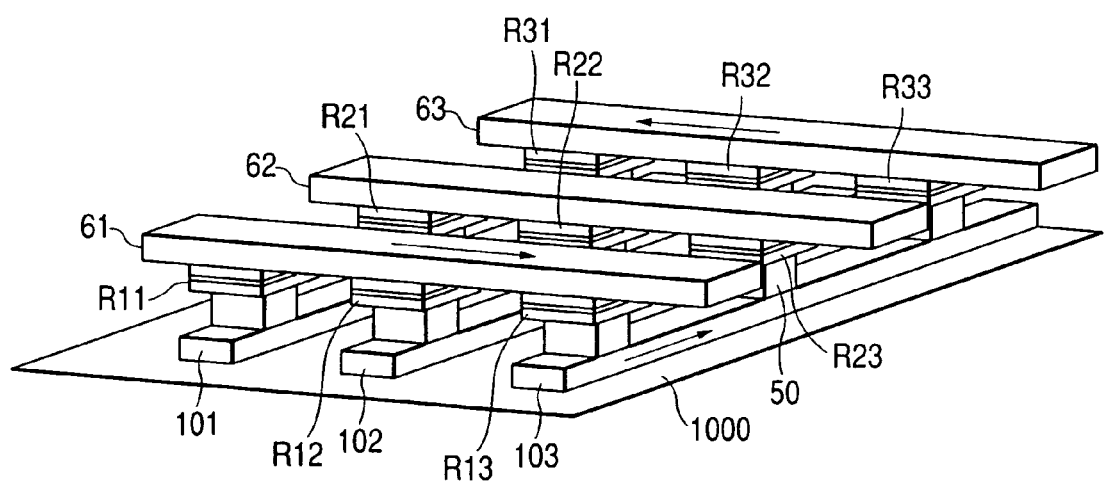
FIG. 22 is a perspective view showing another example of the MRAM structure in Embodiment 6.

The present embodiment presents another structural example of the MRAM. FIG. 21 shows the structure of the MRAM of the present embodiment. Portions without any reference symbol are basically insulators. On a substrate 1000 there are memory devices R11 to R32 each consisting of a first magnetic layer, a nonmagnetic layer, and a second magnetic layer, and bit lines 61 to 63 are provided above those memory devices. Plug electrodes 50 are provided below the memory devices. Ends of the plug electrodes 50 may be connected to drain electrodes of field effect transistors, not shown, so as to construct an active matrix structure, or lower bit lines may be provided at the ends of plug electrodes 50 so as to be perpendicular to the upper bit lines, thereby constructing a simple matrix structure, as shown in FIG. 22. The plug electrodes do not always have to be provided.

Write lines 101, 102 are provided so as to be perpendicular to the bit lines through an insulating film in the vicinity of the memory devices. The memory devices have the first magnetic layer and the second magnetic layer constituting the magnetoresistive film, and the two magnetic layers are magnetized both in the perpendicular direction.

The magnetoresistive film is one of the structure in which the first magnetic layer and the second magnetic layer are stacked with the nonmagnetic layer in between, and will be described using an example of the spin tunneling film structure using an insulator as the nonmagnetic layer herein. It is, however, noted that the magnetoresistive film is not limited to this example. The first magnetic layer and the second magnetic layer have their major magnetization direction along the perpendicular direction and are preferably those having the easy axis of magnetization along this direction.

These magnetic layers are preferably alloys of a rare earth element and an iron-group element (RE-TM) and, specifically, is preferably selected from GdFe, GdFeCo, TbFe, TbFeCo, DyFe, DyFeCo, and so on. In addition to these, the magnetic layers may also be selected from PtCo, PdCo, CoCr, etc. and can be any material that has the major magnetization direction along the perpendicular direction, without having to be limited to these examples. However, the rare earth-iron group alloys are more desirable, because they are amorphous at room temperature and produce no grain boundary noise or the like, which is encountered in use of a crystal body, so as to reduce electric noise.

It is also desirable to interpose a magnetic layer having a large resistance change rate and being magnetically coupled with the first magnetic layer or the second magnetic layer, between the first magnetic layer and the insulating layer and/or between the second magnetic layer and the insulating layer. Examples of this magnetic layer are Fe, Co, CoFe, and so on. The magnetic coupling can be conceivably either of exchange coupling and static magnetic coupling, either of which can be applied. However, it is desirable to utilize the exchange coupling.

Reproduction is effected by utilizing the phenomenon in which, when an electric current is supplied perpendicular to the film surface, electrons migrate from the first magnetic layer into the second magnetic layer because of the tunneling phenomenon. Since the tunneling phenomenon occurs with the conduction electrons maintaining their spins in the magnetic films, the probability of tunneling electrons varies depending upon the magnetization states of the two magnetic layers, which appears as a change of the electric resistance. Accordingly, the resistance of the magnetoresistive film in the stack direction differs depending upon relative angles between the magnetizations of the first magnetic layer and the second magnetic layer. More specifically, the resistance is low in a parallel state of magnetizations, but the resistance is high in an antiparallel state of magnetizations. The larger the difference between state densities of upward spins and downward spins, the higher the resistance and the greater the reproduced signals are obtained. Therefore, it is desirable to use magnetic materials with high spin polarizability for the upper and lower magnetic layers above and below the insulating layer. For example, such materials can be selected from materials containing Fe and/or Co or the like with large polarization levels of upward and downward spins on the Fermi surface, as major components.

The thicknesses of the first magnetic layer and the second magnetic layer are desirably not less than 2 nm nor more than 50 nm. The reasons are as follows. In the range wherein the thicknesses of the magnetic layers are less than 2 nm, the volumes of the first magnetic layer and the second magnetic layer become smaller with decrease in the size of the memory devices to the submicron order, and the perpendicular magnetic anisotropy energy of each layer is lowered according thereto, thereby weakening the magnetization retaining function of each layer. The thicknesses of the magnetic layers are more desirably not less than 5 nm. When the thicknesses of the magnetic layers are more than 50 nm, there arises a problem, e.g., a problem that the resistance of the cells becomes too large. Therefore, the thicknesses of the magnetic layers are desirably not more than 50 nm.

The nonmagnetic layer has to be an insulating layer in the case of the magnetoresistive film of the spin tunneling structure, because electrons tunnel while maintaining their spins. The whole of the nonmagnetic film may be an insulating layer, or a part thereof may be an insulating layer. An example of the insulating layer is an oxide film resulting from oxidation of a nonmagnetic metal film, which is often utilized. An example is an $Al_2O_3$ layer produced by oxidizing part of an Al film in air or in vacuum by plasma oxidation, for example. Other examples are aluminum nitride AlNx, silicon oxide SiOx, silicon nitride SiNx, and NiOx. Preferably, it is aluminum oxide AlOx. The reason is that an adequate potential barrier needs to exist against the energy of conduction electrons in the first magnetic layer and the second magnetic layer in the spin tunneling structure and AlOx can readily provide this barrier and is produced in a simple production process.

The nonmagnetic layer is a uniform layer having the thickness of about several nm and the thickness of the insulating part is desirably not less than 0.5 nm nor more than 3 nm. Reasons are as follows. In the range less than 0.5 nm, there is a possibility that the first magnetic layer and the second magnetic layer can be electrically short-circuited. In the range over 3 nm, the tunneling phenomenon of electrons becomes hard to occur. Further, the thickness is more desirably not less than 1 nm nor more than 2.5 nm.

Recording is effected by letting an electric current flow in the write line placed in the vicinity of the first and second magnetic layers and reversing the magnetization in the first magnetic layer or the second magnetic layer by a magnetic field generated by the current. An upward or downward magnetic field is generated depending upon the direction of the electric current and the magnetic field changes the orientation of spins to the upward or downward direction.

The write line is arranged to permit such flow of the electric current as to apply the magnetic field in the perpendicular direction, i.e., in the direction of easy magnetization to the magnetoresistive film. For implementing it, the write line is placed so as to let the electric current flow in parallel to the film surface. An insulating film is placed between the write line and the magnetoresistive film in order to prevent the write line from being electrically connected to the magnetoresistive film so as to cause a leak of the electric current supplied to the magnetic thin film device, into the write line during reproduction to degrade reproduced signals.

The spacing between the write line and the magnetoresistive film is at least not less than 1 nm nor more than 500 nm and desirably not less than 5 nm nor more than 100 nm, because a sufficient magnetic field cannot be applied in the longer spacing range and because in the shorter spacing range dielectric breakdown can occur between the write line and the magnetoresistive film and a tunneling current might flow.

In a configuration wherein memory devices are arrayed in a matrix pattern, the magnetic field is also applied similarly to the magnetoresistive film near the write line. For this reason, an electric current is also made to flow through the bit line, as described above, so as to apply a great resultant magnetic field to only the magnetoresistive film at an intersection, thereby selecting a specific memory cell.

A recording method, particularly, in selection of a specific memory device, will be described in further detail referring to FIG. 21. For example, let us suppose the magnetization state of the memory device R31 in FIG. 21 is to be changed. First, an electric current is made to flow in the direction of an arrow in the write line 101. The current applies an upward magnetic field to the memory devices R11, R21, R31 near the write line. A sufficient magnetic field is not applied to the memory devices R12, R22, R32, because they are apart from the write line 101. Then an electric current is made to flow in the direction of an arrow in the bit line 62. This current applies an upward magnetic field to the memory devices R31, R32. The current also applies a downward magnetic field to the memory devices R11, R12.

Therefore, the strong, perpendicular magnetic field is applied to only the memory device R31. No sufficient magnetic field is applied to the other memory devices. Accordingly, if the magnetization reversal magnetic field of the magnetic layer is set between the magnetic field from the write line and the resultant magnetic field of the magnetic fields from the write line and from the adjacent bit line, it becomes feasible to change the magnetization state of only a specific device out of a number of memory devices arrayed in the matrix pattern.

The electric currents to the write line and to the bit line may be supplied in the opposite order or they may be simultaneously supplied to the write line and to the bit line. Either one of the electric currents may be gradually decreased. Particularly, in a configuration wherein at least one of the magnetic fields from the bit line and from the write line is directed in a direction inclined from the direction of easy magnetization, the intensity and direction of the magnetic field applied to the memory device can be determined so as to effect easy magnetization reversal, by first stopping application of the magnetic field in the direction inclined from the easy axis of magnetization and thereafter stopping the magnetic field in the direction of easy magnetization. Particularly, it is preferable to stop the magnetic field in the direction inclined from the easy axis of magnetization before complete magnetization reversal of magnetization of the magnetic film and keep the intensity of the magnetic field in the direction of easy magnetization until perfect reversal of magnetization. The control on this occasion can be implemented by providing a circuit for controlling the timing and/or magnitude of pulses applied to the write line or to the bit line, in the peripheral area.

The above described the example wherein the write line 101 was close to the memory device R11 but distant from R12, but the present invention can also be applied to a configuration wherein the write line 101 is located at equal distances to the memory devices; for example, an object to interrupt the magnetic field, e.g., a soft magnetic film like the permalloy or the like is placed between the write line 101 and the memory devices R12, R22, R32, so as to control the intensity of the magnetic field generated from the write line 101, thereby preventing the sufficient magnetic field from being applied to the memory devices R12, R22, R32. Similarly, in the other devices, it is also feasible to appropriately control the applied magnetic field by providing a layer serving as an antimagnetic shield, or selection of a device may be implemented by use of devices demonstrating different intensities of the magnetization reversal field, depending upon the directions of application of the magnetic field.

Figure 23:
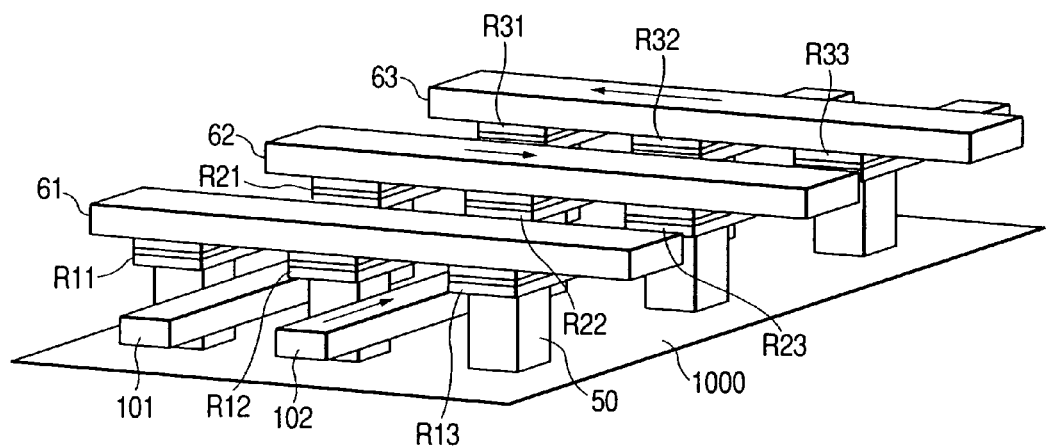
FIG. 23 is a perspective view showing still another example of the MRAM structure in Embodiment 6.

Recording may also be implemented, as shown in FIG. 23, by letting electric currents flow in a write line, one adjacent bit line, and a bit line connected to a memory device to be recorded, thereby specifying the memory device. In this case, applied to the specific memory device are the magnetic field in the longitudinal direction, i.e., in the direction inclined from the easy axis of magnetization from the bit line and the magnetic field in the direction of easy magnetization from the write line.

For selecting the specific memory device, to which bit line the electric current is to be supplied between the bit line connected to the adjacent device and the bit line connected to the selected device is adequately selected depending upon the layout of the MRAM, and is determined according to the electric current to be supplied, the number of lines, the distance between adjacent devices, and the distance to the bit line.

In the MRAMs, since the bit lines can be normally located in close vicinity to the memory devices, it is preferable to apply the magnetic field in the direction inclined from the easy axis of magnetization, i.e., in the longitudinal direction from the bit line connected to the selected device and apply the magnetic field in the direction of easy magnetization from the write line, which requires small electric currents.

By using the bit lines for recording as in the present embodiment, it becomes feasible to apply the resultant magnetic field from two conductor lines to the memory device and select a specific device, without complicating the device structure.

Even if the memory devices using the perpendicular magnetic films are made as fine as not more than 1 μm, spin curling will not occur. For this reason, in the magnetoresistive film of the present embodiment, the ratio of width to length can be 1, and preservability of magnetization is not lost even if the width (=length) is reduced to 0.5 μm, 0.2 μm, 0.1 μm, or 0.05 μm. Therefore, the cell area can be made small, thereby enhancing the degree of integration.

In general, there are two types of information readout methods, the absolute detection method and the differential detection method as described previously, in the MRAMs, which will be described below in further detail. First, the structure of the magnetoresistive film used in the absolute detection method is "memory layer (first magnetic layer)/nonmagnetic layer/pinning layer (second magnetic layer)," wherein the first magnetic layer is a memory layer for storing magnetization information and the second magnetic layer is a pinning layer in which magnetization is always oriented in a fixed direction in either state of storage, recording, and reproduction. For example, data of "0" or "1" is made to correspond to upward or downward orientation, respectively, of the magnetization in the first magnetic layer. Information is recorded by reversing the magnetization in the first magnetic layer by the magnetic field generated by the electric current flowing in the write line. After this, the resistance becomes small with "0" and the resistance becomes large with "1". Therefore, information can be detected during reproduction according to the absolute values of resistance, without effecting the magnetization reversal in the magnetic layer. Therefore, there is no need for the magnetization reversal for detection of change in resistance during reproduction, and thus the reproduction can be implemented at high speed and by low current consumption. The orientation of the spin in the second magnetic layer was upward in the above description, but it may be downward. In addition, the data "0" and "1" may also be made to correspond to the downward and upward directions, respectively, of magnetization in the first magnetic layer, of course.

The magnetic materials for the first magnetic layer and the second magnetic layer both can be the aforementioned RE-TM materials, and the second magnetic layer being the pinning layer is desirably selected from TbFe, TbFeCo, DyFe, DyFeCo, etc. exhibiting particularly high coercive force.

The coercive force of the first magnetic layer being too low will degrade the memory performance, while the coercive force being too high will require a large recording current. Therefore, the coercive force of the first magnetic layer is desirably not less than 5 Oe nor more than 50 Oe. The coercive force of the second magnetic layer being too low will raise the possibility of magnetization reversal during recording or reproduction, and the coercive force being too high will require a hard initialization work to align spins in one direction. Therefore, the coercive force of the second magnetic layer is desirably not less than 20 Oe nor more than 20 kOe. The coercive force of the first magnetic layer is desirably approximately half of the coercive force of the second magnetic layer.

The differential detection method will be described next. The structure of the memory devices used in the differential detection method is "detection layer (first magnetic layer)/nonmagnetic layer/memory layer (second magnetic layer)," wherein the second magnetic layer is used as a memory layer for storing information and the first magnetic layer is provided for reading information stored in the second magnetic layer, by making use of the magnetoresistance effect. The data "0" or "1" is made to correspond to the upward or downward orientation, respectively, of magnetization in the second magnetic layer. Recording is implemented by reversing the magnetization in the second magnetic layer by the magnetic field generated by a recording electric current.

For readout of information, a weaker magnetic field than that during recording is generated by supplying a weaker electric current to the write line than during recording, or by providing two write lines and supplying an electric current to only one write line, whereby only the magnetization in the detection layer is reversed without reversal of magnetization in the memory layer. This results in changing the resistance from a small value to a large value in the case of "0" or changing the resistance from a large value to a small value in the case of "1", whereby the information recorded can be detected by the change of resistance.

Since the differential detection method can detect even a fine signal change through use of a differentiation detection method or the like, the information can be reproduced with good detection sensitivity.

The magnetic materials for the first magnetic layer and the second magnetic layer both can be the rare earth-iron group alloy (RE-TM) materials, and the both layers are desirably selected from GdFe, GdFeCo, etc. exhibiting lower coercive force, because the magnetization is reversed in the both layers during recording or reproduction. The coercive force of the first magnetic layer being too low will degrade reproduced signals, and the coercive force being too high will increase the reproduction current. Therefore, the coercive force of the first magnetic layer is desirably not less than 2 Oe nor more than 20 Oe. The coercive force of the second magnetic layer being too low will degrade the memory performance, and the coercive force being too high will increase the recording current. Therefore, the coercive force of the second magnetic layer is desirably not less than 5 Oe nor more than 50 Oe. The coercive force of the first magnetic layer is desirably about half of the coercive force of the second magnetic layer.

Embodiment 7

Figure 24:
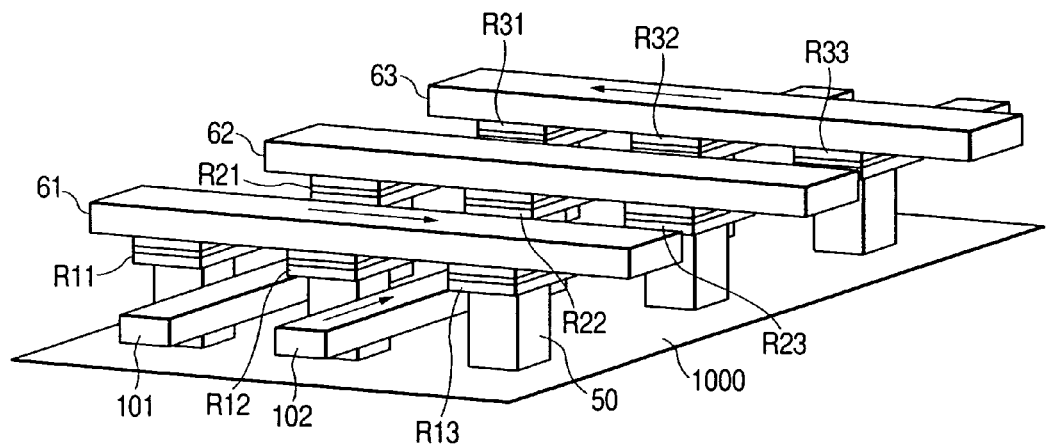
FIG. 24 is a perspective view showing an example of the MRAM structure in Embodiment 7.

FIG. 24 shows the structure of the MRAM in the present embodiment. In the present embodiment the magnetic fields are applied to a memory device to be selected through use of a write line and bit lines connected on the both sides to memory devices adjacent to the selected memory device. For example, let us explain a case in which the magnetization state in the memory device R22 is changed.

Electric currents in opposite directions as indicated by arrows are supplied to respective, adjacent bit lines 61 and 63. This results in applying an upward, resultant magnetic field to the memory devices located below the bit line 62. Further, an electric current in a direction indicated by an arrow is also supplied to the write line 102, whereupon a stronger resultant magnetic field is applied to the memory device R22 than to the other memory devices among the memory devices located below the bit line 62.

By reversing the directions of these electric currents, a downward magnetic field can be applied. Since the magnetic films magnetized in the perpendicular direction are used for the memory devices of the present embodiment, it becomes feasible to change the magnetization state of only a specific memory device out of a number of memory devices arrayed in a matrix pattern.

The order of supply of the electric currents to the write line and to the bit lines may be opposite, or the electric currents may also be simultaneously supplied to the write line and to the bit lines. On this occasion, it is preferable to supply the electric currents in such a manner as to first stop the application of the magnetic field inclined from the direction of easy magnetization and thereafter stop the application of the magnetic field from the direction of easy magnetization in view of the positional relation between devices and lines, because it becomes easier for magnetization to be oriented in the direction of easy magnetization. In the MRAM, there are restrictions on the positional relation between memory devices and lines, and thus, in order to select a specific device and record information therein, an arbitrary combination of a write line with bit lines can be selected according to the layout in the memory cells. In this case there is provided a peripheral circuit for control of application timing of magnetic fields.

In the present embodiment, even in the structure wherein each write line is in the middle between adjacent memory devices and intervals of bit lines are equal, e.g., even in the structure wherein the distance between the write line 102 and the memory device R22 is equal to the distance between the write line 102 and the memory device R23 and the interval between the bit lines 61 and 62 is equal to the interval between the bit lines 62 and 63, it is feasible to change the magnetization state of a specific memory device among the memory cells arrayed in the matrix pattern. Accordingly, the memory can be realized in-high density of integration.

Embodiment 8

FIG. 25 shows the structure of the MRAM of the present embodiment. FIG. 25 is a cross-sectional view of the structure in which transistors are provided below the memory devices. Portions without any reference symbol basically represent insulator portions. On a semiconductor substrate 1 there are MOS (Metal-Oxide-Semiconductor)-FETs (Field Effect Transistors) each consisting of drain region 3, source region 2, and gate electrode 4. Each memory device 30 is connected through plug electrode 50 to the drain electrode 13 of the corresponding field effect transistor and is formed immediately above the drain region. Numeral 12 denotes source electrodes, 13 drain electrodes, 10 write lines, and 6 bit lines. Although not shown, a permalloy layer capable of serving as an antimagnetic shield may be interposed between the memory devices 30 of the magnetoresistive film and the bit lines 6. It is also possible to control the magnetic field applied from the bit lines, by placing contact plugs on the magnetoresistive elements to change the distance to the bit lines 6.

The present embodiment permits the resultant magnetic field from two or three conductor lines to be applied to the magnetoresistive elements, without complicating the device structure, thus permitting easy selection of a specific device.

The structure provided with the field effect transistors as in the present embodiment is desirable for achievement of a large-capacity memory with fast rewriting speed in the matrix array of many memory cells. The reason is that the simple matrix structure is substantially required to provide each magnetoresistive element with a diode and this diode has a capacitive component of capacitance which delays a rise of a signal during reproduction of information. It is, however, noted that, in use within the tolerance range accepting this speed delay, the occupying area of the memory cells can also be reduced in the simple matrix structure, thereby achieving the high density of integration.

Embodiment 9

FIG. 26 shows a structure example of the memory in the present embodiment. Elements having functions similar to those in FIG. 25 are denoted by the same numerals. FIG. 26 is a cross-sectional view of the structure in which each source region is shared between adjacent memory cells in the structure provided with the field effect transistors below the memory devices. In the present embodiment, for detecting a resistance of a memory device, a fixed potential is applied to an end of a bit line and the source of the corresponding field effect transistor is set at the ground potential, whereby a potential corresponding to the resistance of the memory device is outputted to the other end of the bit line. This potential is compared with a reference potential to be detected. When each source electrode is shared between adjacent cells as in the present embodiment, the number of source electrodes can be reduced, which enables simplification of the structure. Namely, the present embodiment permits the resultant magnetic field from two or three conductor lines to be applied to a specific memory device, without complicating the device structure, and can also decrease the number of source electrodes in the structure wherein the field effect transistors are provided below the memory devices.

Embodiment 10

Figure 27:
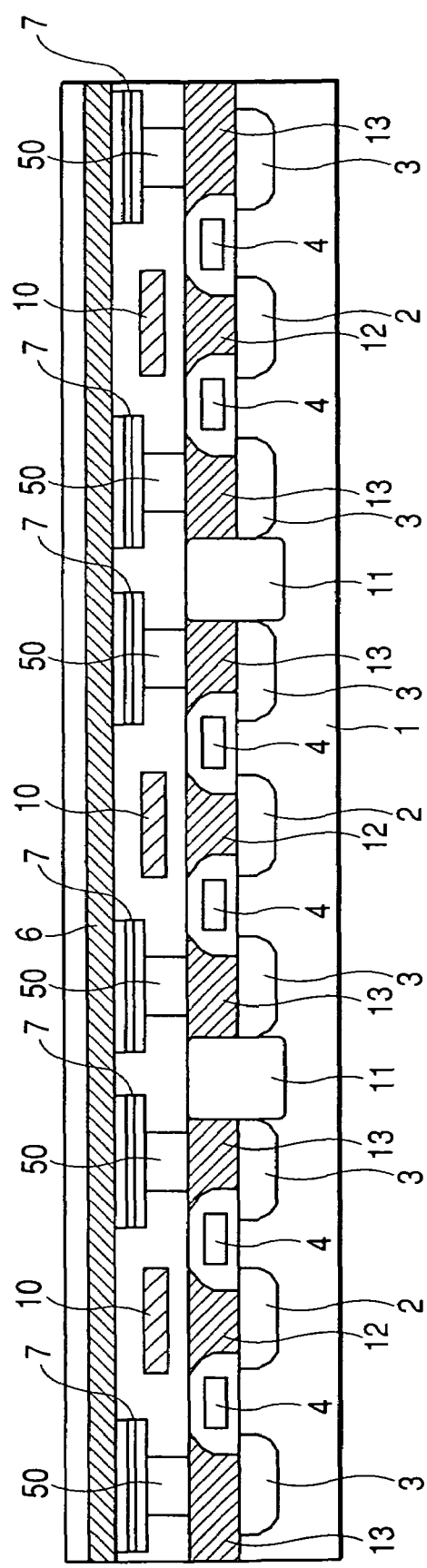
FIG. 27 is a schematic view showing an MRAM structure in Embodiment 10.

FIG. 27 shows a structure example of the memory in the present embodiment. Elements having functions similar to those in FIG. 25 are denoted by the same numerals. The present embodiment is an example of the structure in which field effect transistors are provided below the memory devices and in which each write line is shared between adjacent memory cells. On a semiconductor substrate 1 there are MOS-FETs each consisting of drain region 3, source region 2, and gate electrode 4, and each source region 2 is shared between adjacent field effect transistors. Two field effect transistors sharing no source region are electrically isolated from each other by shallow trench isolation 11.

Figure 28:
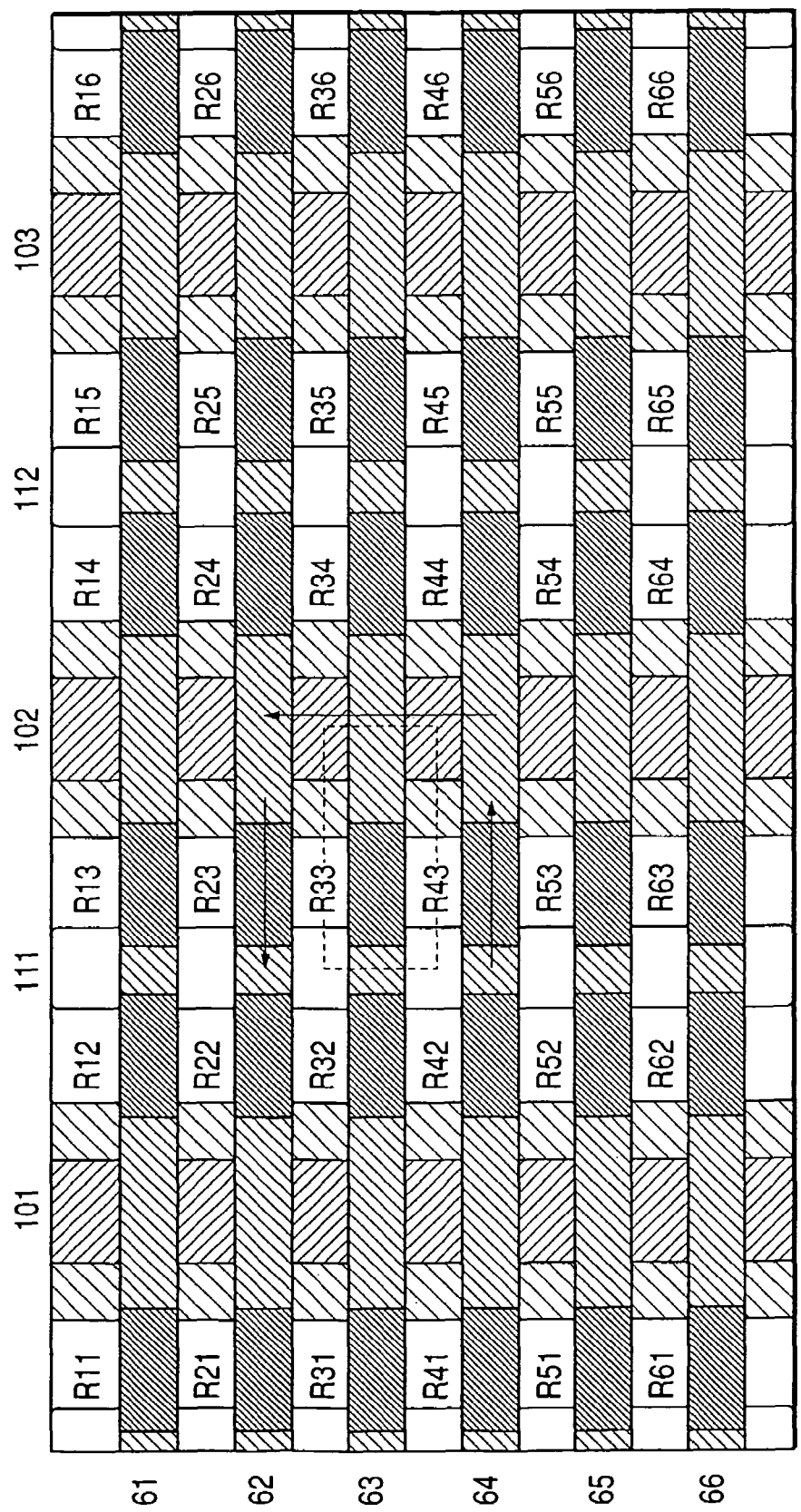
FIG. 28 is a plan view showing the MRAM structure in Embodiment 10.

Each memory device 30 having the magnetoresistive film magnetized in the perpendicular direction is connected through plug electrode 50 to the drain region 3 of the corresponding field effective transistor, located immediately above the drain region 3, and further connected to the bit line 6. The source electrode 12 is provided with a ground line, which is not shown. The write lines 10 are arranged through an insulator beside the memory devices 30. The write lines 10, gate lines 4, and the ground lines connected to the source electrodes 12 extend in the normal direction to the plane of the drawing. The bit lines extend in the direction parallel to the plane of the drawing. FIG. 28 is a plan view of the memory structure shown in FIG. 27. The memory devices R11 to R16 comprised of the magnetoresistive film are connected to a bit line 61. Likewise, the memory devices R21 to R26 are connected to a bit line 62, R31 to R36 to a bit line 63, R41 to R46 to a bit line 64, R51 to R56 to a bit line 65, and R61 to R66 to a bit line 66. The bit lines and write lines correspond each to those described in FIG. 27. The shallow trench isolation regions 111, 112 are placed in parallel to the write lines. There is also a shallow trench isolation region provided between bit line 61 and bit line 62, and the same also applies to the regions between the other bit lines.

The recording method of the present embodiment will be described referring to FIG. 28. FIG. 28 is a plan view of the memory cells seen from above FIG. 27. For example, let us assume that information is recorded in a memory cell including R33 in the part surrounded by a dashed line in FIG. 28. When an electric current is supplied in the direction of an arrow to the write line 102, an upward magnetic field is applied to R13 to R63, whereas a downward magnetic field is applied to R14 to R64. At the same time as it, electric currents in opposite directions to each other are supplied as indicated by arrows, to the adjacent bit lines 62 and 64. This results in applying an upward resultant magnetic field of magnetic fields from the bit lines to the memory devices R31 to R36. Therefore, a strong magnetic field is applied to only the memory device R33. The direction of the magnetic field can be varied to the upward direction or to the downward direction, depending upon the directions of the electric currents, and information can be selectively recorded in only a specific memory cell by selecting a write line for the electric current to flow.

The reproduction method will be described in further detail with reference to FIG. 28. For example, let us assume that information is read out of the memory cell including the memory device R33 in FIG. 28. First, the electric currents in the directions of arrows are supplied to the write line 102 and to the adjacent bit lines 62 and 64, as in the case of recording. This results in applying an upward magnetic field to R33. By setting the electric current values to smaller values than during the recording, the magnetization only in the detection layer can be reversed while the magnetization direction in the memory layer is maintained. Since the direction of the applied magnetic field can be changed to the upward direction or to the downward direction by the directions of the electric currents, the magnetization in the detection layer can be reversed by supplying positive and negative current pulses, and the information can be read by detecting changes of resistance occurring at that time, through the bit line 63. The data "0" and "1" may be made to correspond to the downward magnetization and the upward magnetization, respectively, in the second magnetic layer.

Intensities of the magnetic fields applied to the memory devices are as follows. When the electric current of 2.4 mA (in the current density of 20 mA/μm$^2$) is supplied to the write line 0.3 μm wide and 0.4 μm thick and the electric current of 0.8 mA (in the current density of 10 mA/μm$^2$) to the bit lines 0.2 μm wide and 0.4 μm thick, using semiconductor processing equipment with the design rule of 0.2 μm, the magnetic field of about 15 Oe is applied to the magnetic films at a point 0.2 μm apart from the center of the wiring line in the direction of thickness. At this time, only the magnetic field of 10 Oe or less is applied to the adjacent memory cells.

When the electric current of 2.4 mA (in the current density of 20 mA/μm$^2$) is supplied to the write line 0.4 μm wide and 0.3 μm thick and the electric current of 0.8 mA (in the current density of 20 mA/μm$^2$) to the bit lines 0.2 μm wide and 0.2 μm thick, using the semiconductor processing equipment with the design rule of 0.2 μm, the magnetic field of 13 Oe is applied at a point where the distance to the generating point of the magnetic field is 0.35 μm from the center of the write line and the distance from the center of the bit line is 0.10 μm. Only the magnetic field of 8 or less Oe on average is applied to the surrounding memory cells.

In the structure of the present embodiment, even if each write line is shared between adjacent memory cells left and right to simplify the structure, there is no need for provision of new other write lines, which can simplify the device structure. Since the magnetic fields are applied to the memory device through use of three conductor lines, the strong resultant magnetic field can be applied thereto and it is thus feasible to write information even in the memory devices with large coercive force, which are selected in order to enhance the preservability of information.

Embodiment 11

Figure 29:
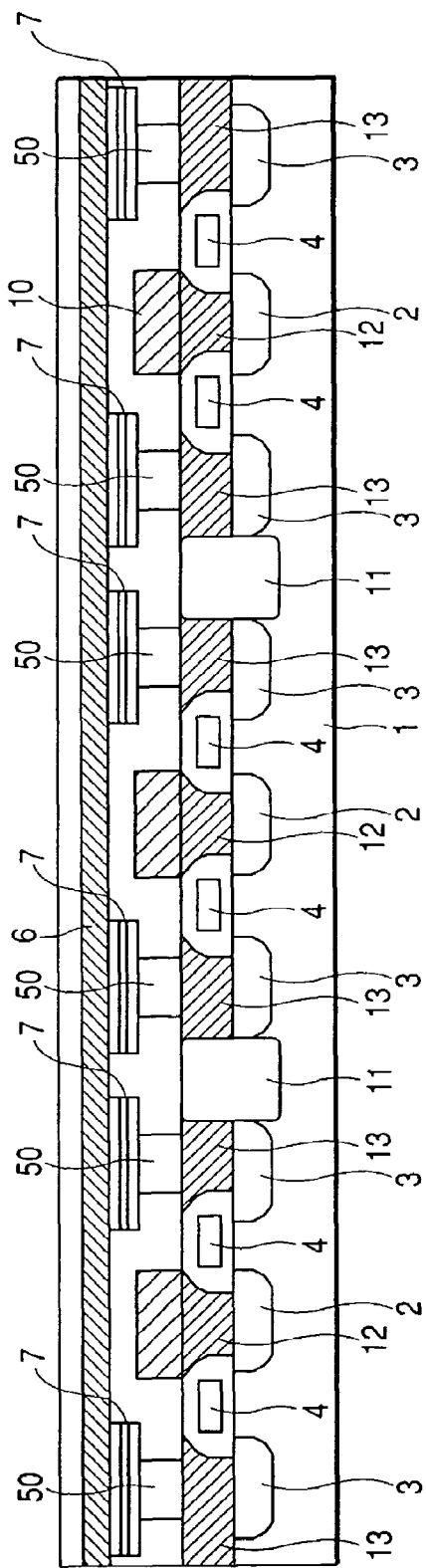
FIG. 29 is a schematic view showing an MRAM structure in Embodiment 11.

FIG. 29 shows a structure example of the memory according to the present invention, used in the present embodiment. Elements having functions similar to those in FIG. 25 are denoted by the same numerals. The present embodiment is an example of the structure in which the write lines are integrated with ground electrodes. Each write line 10 is connected to a ground electrode 12 connected to the source region of the field effect transistor to be integrated therewith. The write lines 10 extend in the normal direction to the plane of the drawing, and switching devices such as field effect transistors or the like are connected to ends of the write lines to be connected to either a ground potential or a current source. The current source out of them is a current source capable of supplying an electric current necessary for writing. The write line is connected to the ground potential in the reading operation, while the write line is connected to the current source in the writing operation.

Since in this structure the write lines are integrated with the ground lines, there is no need for provision of new write lines. This simplifies the device structure.

Embodiment 12

Figure 30:
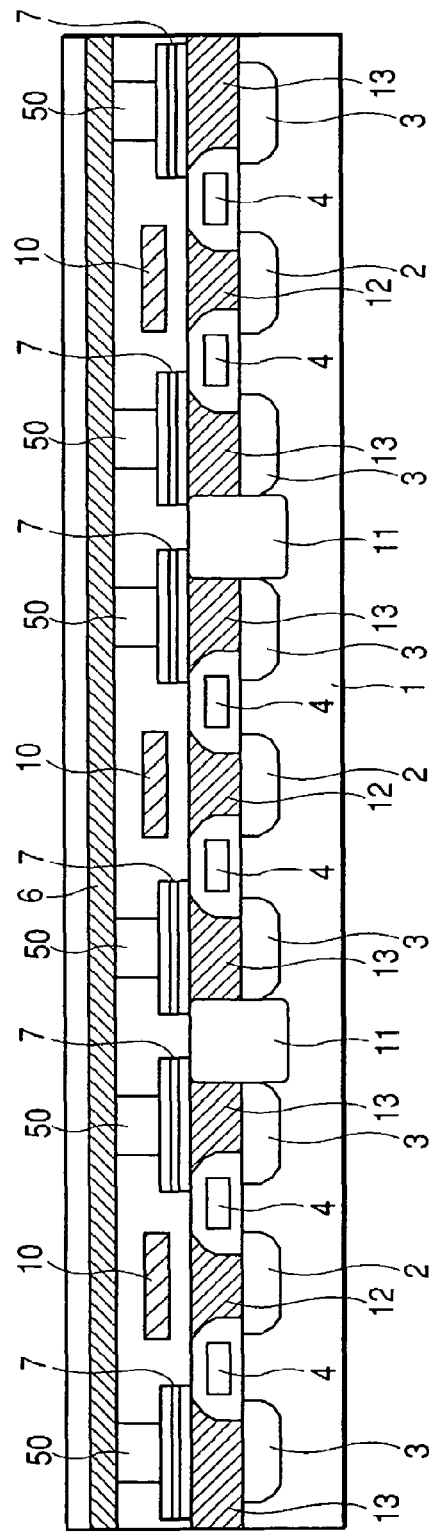
FIG. 30 is a schematic view showing an MRAM structure in Embodiment 12.

FIG. 30 shows a structure example of the memory according to the present invention, used in the present embodiment. Elements having functions similar to those in FIG. 25 are denoted by the same numerals. The present embodiment presents a structure in which the drain electrodes are formed in a self-aligning manner in the structure provided with the field effect transistors below the memory devices. In the device structure of FIG. 25, supposing an alignment deviation is F (minimum processing dimension) for placing the plug electrodes 5 on the drain regions 3, it is necessary to allow for the width of 3 F. Therefore, the area of the drain region 3 needs to allow for the margin of 9×(square of F). In contrast to it, the device structure of the present embodiment requires no alignment margin, because the drain electrodes 13 are formed in the self-aligning manner. Therefore, the alignment margin between the drain region 3 and the drain electrode 13 can be made theoretically null, and the area of the drain region 3 can be made smaller, 1×(square of F). For further miniaturization of the memory, the area ratio is desirably not less than 60% and more desirably not less than 80 to 90%.

Embodiment 13

Figure 32:
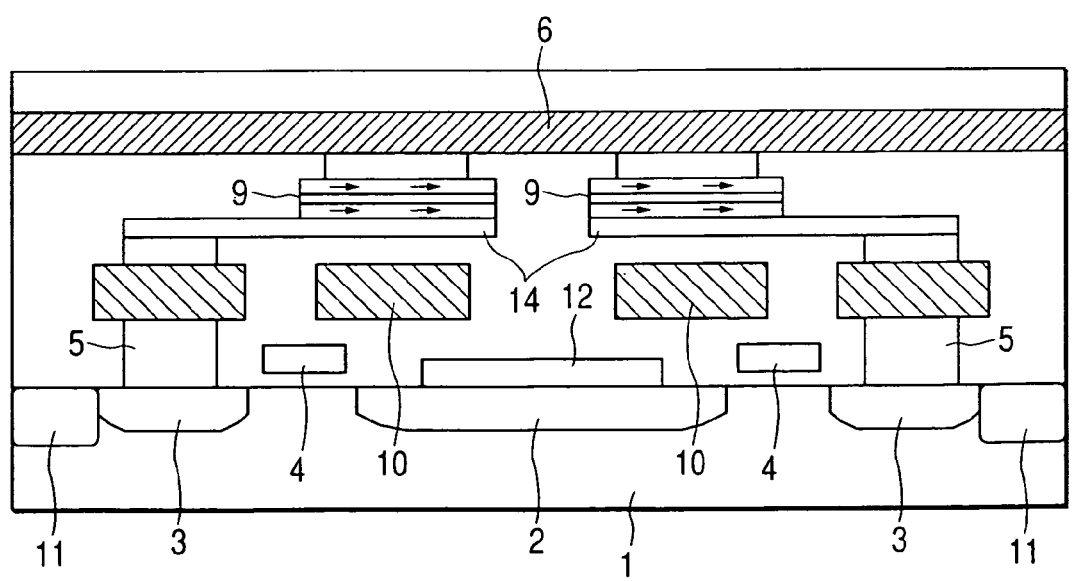
FIG. 32 is a schematic view showing an MRAM structure in Embodiment 13.
Figure 33:
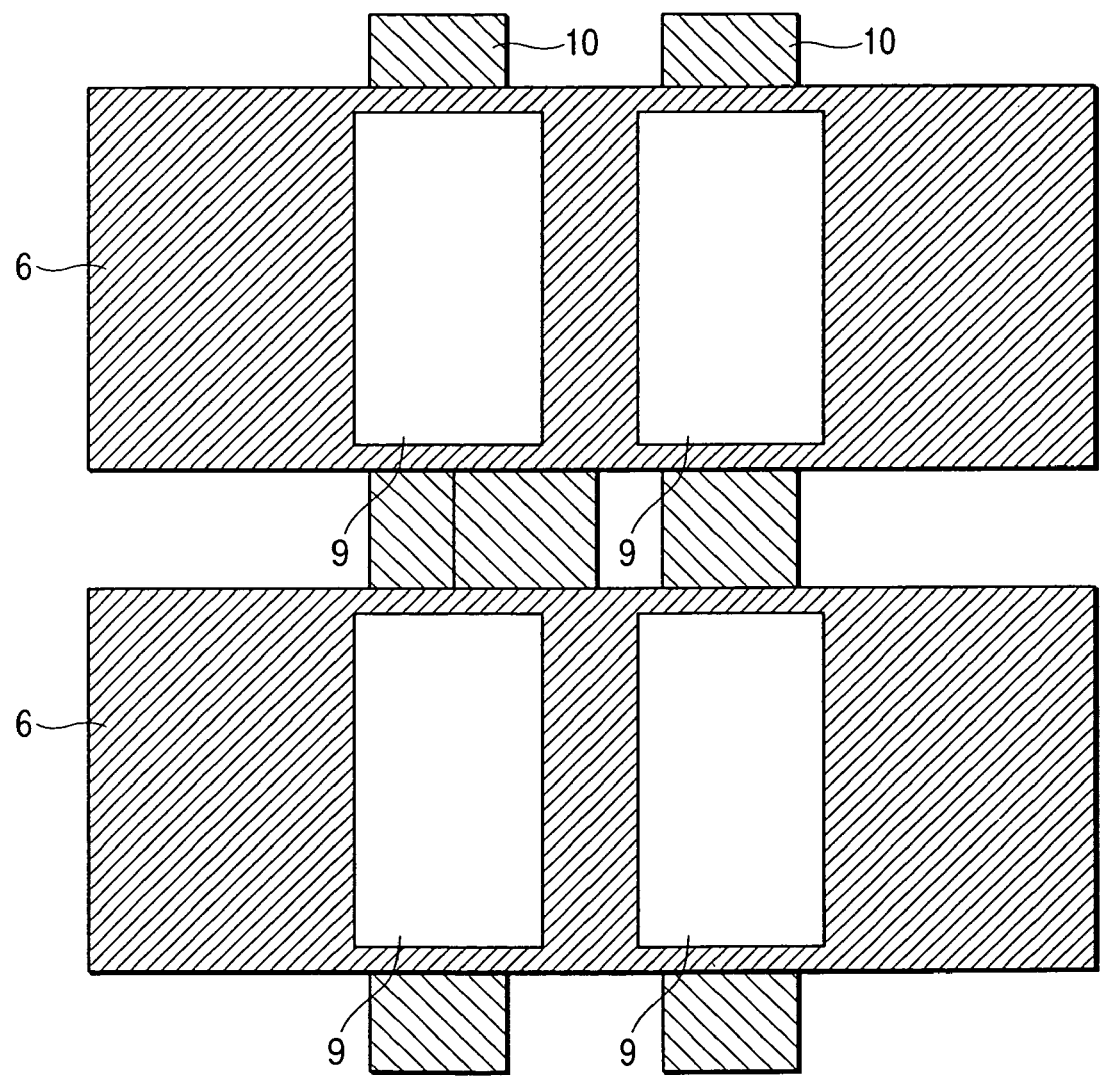
FIG. 33 is a plan view showing the MRAM structure in Embodiment 13.

FIG. 32 is a structural view of the MRAM of the present embodiment. The memory devices of the present embodiment are constructed using the magnetoresistive film having the magnetic films with the easy axis of magnetization within the film plane. Elements having functions similar to those in FIG. 16 are denoted by the same numerals and description thereof is omitted herein. Magnetic fields in the longitudinal direction are applied from the write line 10 and from the bit line 6 to the magnetoresistive film 30. On this occasion, however, the magnetic field from the write line is applied in the direction to which the magnetization of the magnetic film is to be directed, and the magnetic field from the bit line is applied from a direction inclined at a certain fixed angle to the magnetic field from the write line, within the film plane. On this occasion, after the magnetization has been reversed to some extent, the magnetic field from the bit line is applied and thereafter the application of the magnetic field from the write line is stopped, whereby the intensity of the magnetic field from the write line can be made smaller than in the case of simultaneously stopping the application of the magnetic fields from the bit line and from the write line. As a means for varying the intensity and direction of the applied magnetic fields, the peripheral circuitry may be provided with a control means to give a shift between the timing of stopping the application of the magnetic field by the electric current flowing in the bit line and the timing of stopping the application of the magnetic field by the electric field flowing in the write line, for example. FIG. 33 is a plan view of the memory cells in this structure, observed from above.

What is claimed is:

1. A magnetization reversal method of applying an external magnetic field to a magnetoresistive film, comprising the steps of:
    providing said magnetoresistive film having a structure in which a nonmagnetic film is placed between magnetic films which have an easy axis of magnetization along a direction perpendicular to a film plane of the magnetoresistive film, and
    applying said external magnetic field, which comprises a first magnetic field along the easy axis of magnetization of said magnetic film and a second magnetic field along a direction inclined at a predetermined angle from the easy axis of magnetization of said magnetic film.

2. A magnetization reversal method of applying an external magnetic field to a magnetoresistive film, comprising the steps of:
    providing said magnetoresistive film having a structure in which a nonmagnetic film is placed between magnetic films which have an easy axis of magnetization along a direction perpendicular to a film plane of the magnetoresistive film,
    applying said external magnetic field, which comprises a first magnetic field along the easy axis of magnetization of said magnetic film and a second magnetic field along a direction inclined at a predetermined angle from the easy axis of magnetization of said magnetic film, and
    gradually increasing the intensity of the first magnetic field to gradually change the direction of a resultant magnetic field from a direction of $\pi/2$ to the direction perpendicular to the film plane of the magnetoresistive film.

* * * * *